(12) United States Patent
Hou et al.

(10) Patent No.: US 11,506,981 B2
(45) Date of Patent: Nov. 22, 2022

(54) PHOTORESIST PATTERN TRIMMING COMPOSITIONS AND PATTERN FORMATION METHODS

(71) Applicant: Rohm and Haas Electronic Materials LLC, Marlborough, MA (US)

(72) Inventors: Xisen Hou, Lebanon, NH (US); Irvinder Kaur, Northborough, MA (US); Cong Liu, Shrewsbury, MA (US); Mingqi Li, Shrewsbury, MA (US); Kevin Rowell, Salem, MA (US); Cheng-Bai Xu, Southborough, MA (US)

(73) Assignee: ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 290 days.

(21) Appl. No.: 16/872,878

(22) Filed: May 12, 2020

(65) Prior Publication Data

US 2020/0379351 A1 Dec. 3, 2020

Related U.S. Application Data

(60) Provisional application No. 62/855,902, filed on May 31, 2019.

(51) Int. Cl.

| G03F 7/11 | (2006.01) |
| G03F 7/38 | (2006.01) |
| C08F 212/08 | (2006.01) |
| H01L 21/027 | (2006.01) |
| C08F 212/14 | (2006.01) |
| C08F 220/18 | (2006.01) |

(52) U.S. Cl.
CPC .............. *G03F 7/11* (2013.01); *C08F 212/08* (2013.01); *C08F 212/20* (2020.02); *C08F 212/24* (2020.02); *C08F 220/1803* (2020.02); *G03F 7/38* (2013.01); *H01L 21/0274* (2013.01)

(58) Field of Classification Search
CPC combination set(s) only.
See application file for complete search history.

(56) References Cited

U.S. PATENT DOCUMENTS

| 6,180,320 | B1 | 1/2001 | Saito et al. | |
| 6,492,075 | B1 | 12/2002 | Templeton et al. | |
| 2002/0098443 | A1* | 7/2002 | Hatakeyama | G03F 7/0382 548/950 |
| 2003/0017711 | A1 | 1/2003 | Mahorowata et al. | |
| 2009/0311490 | A1 | 12/2009 | Burns et al. | |
| 2013/0171574 | A1 | 7/2013 | Xu | |
| 2013/0171825 | A1 | 7/2013 | Xu | |
| 2013/0337381 | A1* | 12/2013 | Chen | G03F 7/30 430/281.1 |
| 2014/0186772 | A1 | 7/2014 | Pohlers et al. | |
| 2016/0187783 | A1 | 6/2016 | Kaur et al. | |
| 2017/0010535 | A1 | 6/2017 | Fujitani et al. | |

(Continued)

FOREIGN PATENT DOCUMENTS

| CN | 1531018 A | 9/2004 |
| JP | 2002006512 A | 1/2002 |

(Continued)

OTHER PUBLICATIONS

Search report for corresponding Taiwan Application No. 109117169 dated Sep. 1, 2020.

*Primary Examiner* — Anca Eoff

(74) *Attorney, Agent, or Firm* — Jonathan D. Baskin

(57) ABSTRACT

Photoresist pattern trimming compositions comprise a polymer, an aromatic sulfonic acid, and an organic-based solvent system, wherein the polymer comprises polymerized units of general formulas (I) and (II):

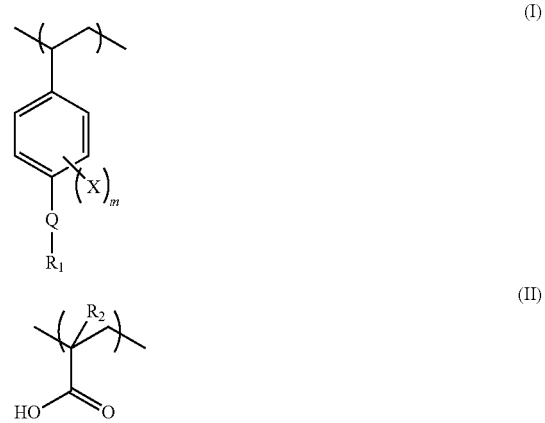

wherein: X independently represents a halogen atom; Q represents a single bond, —O—, or —C(O)O—; $R_1$ independently represents hydrogen, a halogen atom, C1-C12 alkyl or C1-C12 fluoroalkyl; $R_2$ represents C1-C3 alkyl or C1-C3 fluoroalkyl; and m is an integer from 0 to 4; and wherein the polymerized units of general formula (I) are present in the polymer in an amount of 10 to 90 mol % and the polymerized units of general formula (II) are present in the polymer in an amount from 10 to 60 mol %, based on total polymerized units of the polymer. The photoresist pattern trimming compositions and their use in pattern formation methods find particular applicability in the manufacture of semiconductor devices.

16 Claims, 1 Drawing Sheet

(56) References Cited

U.S. PATENT DOCUMENTS

2017/0255102 A1    9/2017   Rowell et al.
2017/0293227 A1   10/2017   Nishita et al.
2018/0314155 A1   11/2018   Hou et al.

FOREIGN PATENT DOCUMENTS

| | | | |
|---|---|---|---|
| JP | 2002299202 | A | 10/2002 |
| JP | 04329216 | B2 | 9/2009 |
| JP | 2013218191 | A | 10/2013 |
| TW | 201912664 | A | 4/2019 |
| WO | 2017110658 | A1 | 6/2017 |
| WO | 2018168252 | A1 | 9/2018 |

\* cited by examiner

PHOTORESIST PATTERN TRIMMING COMPOSITIONS AND PATTERN FORMATION METHODS

CROSS-REFERENCE TO RELATED APPLICATIONS

This application claims the benefit of priority under 35 U.S.C. § 119(e) to U.S. Provisional Application No. 62/855,902 filed on May 31, 2019.

BACKGROUND

The invention relates generally to the manufacture of electronic devices. More specifically, this invention relates to photoresist pattern trimming compositions and to pattern formation methods using such compositions. The compositions and methods find particular use in the formation of fine lithographic patterns.

In the semiconductor manufacturing industry, photoresist materials are used for transferring an image to one or more underlying layers, such as metal, semiconductor or dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing. Such resists typically employ a resin having acid-labile leaving groups and a photoacid generator. Patternwise exposure to activating radiation through a photomask causes the acid generator to form an acid which, during post-exposure baking, causes cleavage of the acid-labile groups in exposed regions of the resin. This creates a difference in solubility characteristics between exposed and unexposed regions of the resist in an aqueous alkaline developer solution. In a positive tone development (PTD) process, exposed regions of the resist are soluble in the aqueous alkaline developer and are removed from the substrate surface, whereas unexposed regions, which are insoluble in the developer, remain after development to form a positive image.

Lithographic scaling has conventionally been achieved by increasing the numerical aperture of optical exposure tools and by use of shorter exposure wavelengths. To form finer photoresist patterns than attainable by direct imaging alone, photoresist pattern trimming processes have been proposed, for example, in U.S. Patent Application Publication Nos. US20130171574A1, US20130171825A1, US2014/0186772A1 and US2016/0187783A1. Photoresist pattern trimming processes typically involve contacting a photoresist pattern that includes a polymer having acid labile groups with a composition containing an acid or thermal acid generator. The acid or generated acid causes deprotection in a surface region of the resist pattern, which region is then removed, for example, by contact with a developer solution. This allows for trimming of the photoresist pattern, resulting, for example, in the creation of finer resist patterns than when using direct imaging alone. With reductions in pattern size and device geometry, however, trimming process considerations such as pattern collapse margin, defect levels and amount of pattern dimension reduction have become of increased importance for their impact on performance and yield of resulting electronic devices.

KrF (248 nm) and EUV (13.4 or 13.5 nm) photoresist materials typically include vinyl aromatic-based polymers, such as styrene and/or polyhydroxystyrene, benefits of which materials generally include high etch resistance, etch selectivity and sensitivity, as well as low cost, as compared with conventional ArF (193 nm) photoresist materials, which typically contain (meth)acrylate polymers and are substantially free of aromatic groups due to their high absorption at the exposure wavelength. Pattern trimming compositions designed for ArF photoresist patterns can be incompatible with KrF and EUV photoresist patterns given the significantly different polymer chemistries of ArF versus KrF and EUV photoresist compositions. Such incompatibility can be exhibited, for example, in severe pattern damage such as caused by washing away of portions of the resist pattern. It would therefore be desirable to have an improved pattern trimming composition for use in KrF and EUV lithography.

There is a need in the art for photoresist pattern trimming compositions and pattern formation methods useful in electronic device fabrication that address one or more problems associated with the state of the art.

SUMMARY OF THE INVENTION

In accordance with a first aspect of the invention, pattern trimming compositions are provided. The compositions comprise a polymer, an aromatic sulfonic acid, and an organic-based solvent system, wherein the polymer comprises polymerized units of general formulas (I) and (II):

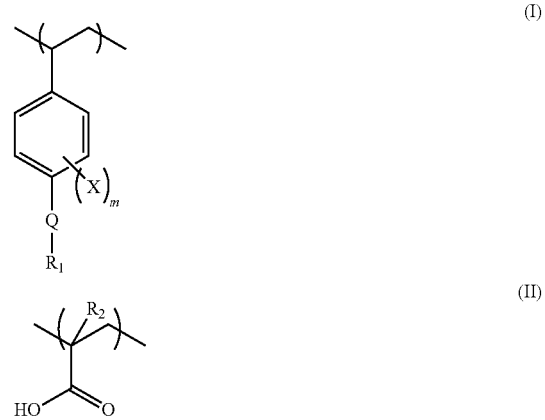

wherein: X independently represents a halogen atom; Q represents a single bond, —O—, or —C(O)O—; $R_1$ independently represents hydrogen, a halogen atom, C1-C12 alkyl or C1-C12 fluoroalkyl, wherein the alkyl or fluoroalkyl is unsubstituted or substituted with a hydroxy group; $R_2$ represents hydrogen, C1-C3 alkyl or C1-C3 fluoroalkyl; and m is an integer from 0 to 4; and wherein the polymerized units of general formula (I) are present in the polymer in an amount of from 10 to 90 mol % and the polymerized units of general formula (II) are present in the polymer in an amount from 10 to 60 mol %, based on total polymerized units of the polymer.

Also provided are pattern formation methods. The methods comprise: (a) providing a semiconductor substrate; (b) forming a photoresist pattern over the semiconductor substrate, wherein the photoresist pattern is formed from a photoresist composition comprising a polymer comprising an acid labile groups and a photoacid generator; (c) coating a pattern trimming composition as described herein over the photoresist pattern; (d) heating the coated photoresist pattern; and (e) rinsing the heated photoresist pattern with a rinsing agent to remove residual pattern treatment composition. Preferable methods and compositions of the invention can provide photoresist patterns having improved characteristics, for example, in one or more of change in critical dimension (ΔCD), pattern collapse margin (PCM) or coating defectivity.

The terminology used herein is for the purpose of describing particular embodiments only and is not intended to be limiting of the invention. The singular forms "a", "an" and "the" are intended to include singular and plural forms, unless the context indicates otherwise. As used herein, the term "substituted" refers to a group having one or more of its hydrogen atoms replaced with one or more substituents selected from hydroxy, halogen, $C_{1-20}$ alkyl, $C_{1-20}$ alkoxy, $C_{6-20}$ aryl or $C_{4-20}$ heteroaryl.

DESCRIPTION OF THE DRAWINGS

The present invention will be described with reference to the following drawing, in which like reference numerals denote like features, and in which.

DETAILED DESCRIPTION

Photoresist Pattern Trimming Compositions

Figure 1A:
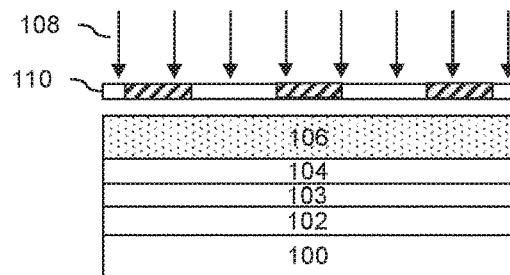
FIG. 1A-H illustrates an exemplary process flow for forming a pattern in accordance with the invention.

Photoresist pattern trimming compositions of the invention include a polymer, an aromatic sulfonic acid, and an organic-based solvent, and can include one or more optional additional components. The polymer allows for the compositions to be coated over the photoresist pattern in the form of a layer having a desired thickness. The polymer should have good solubility in the rinsing agent to be used in the patterning process. For example, the polymer can be soluble in an aqueous alkaline solution such as those typically used as photoresist developers, preferably aqueous quaternary ammonium hydroxide solutions such as aqueous tetramethylammonium hydroxide (TMAH), typically 0.26N TMAH. To minimize residue defects originating from the pattern trimming composition, the dissolution rate of a dried layer of the trimming composition in a rinsing agent to be applied should be greater than that of the photoresist pattern in the rinsing agent. The polymer typically exhibits a dissolution rate in the rinsing agent, preferably a 0.26N TMAH solution, of 100 Å/second or higher, preferably 1000 Å/second or higher. The polymer should be soluble in the solvent of the trimming composition, described herein.

The pattern trimming composition polymer comprises polymerized units of general formulas (I) and (II):

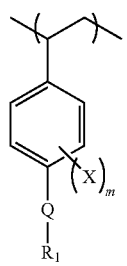

(I)

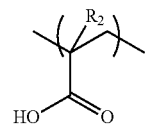

(II)

wherein: X independently represents a halogen atom, typically fluorine or chlorine; Q represents a single bond, —O—, or —C(O)O—; $R_1$ independently represents hydrogen, a halogen atom, C1-C12 alkyl, typically C1-C5 alkyl, or C1-C12 fluoroalkyl, typically C1-C5 fluoroalkyl, wherein the alkyl or fluoroalkyl can be linear, branched or cyclic, and can be unsubstituted or substituted with a hydroxy group; $R_2$ represents hydrogen, C1-C3 alkyl or C1-C3 fluoroalkyl, with hydrogen or methyl being typical; and m is an integer from 0 to 4. The polymerized units of general formula (I) are present in the polymer in an amount of from 10 to 90 mol %, typically from 30 to 70 mol %. The polymerized units of general formula (II) are present in the polymer in an amount from 10 to 60 mol %, typically from 30 to 60 mol %, based on total polymerized units of the polymer.

Suitable polymerized units of general formula (I) include, for example, the following:

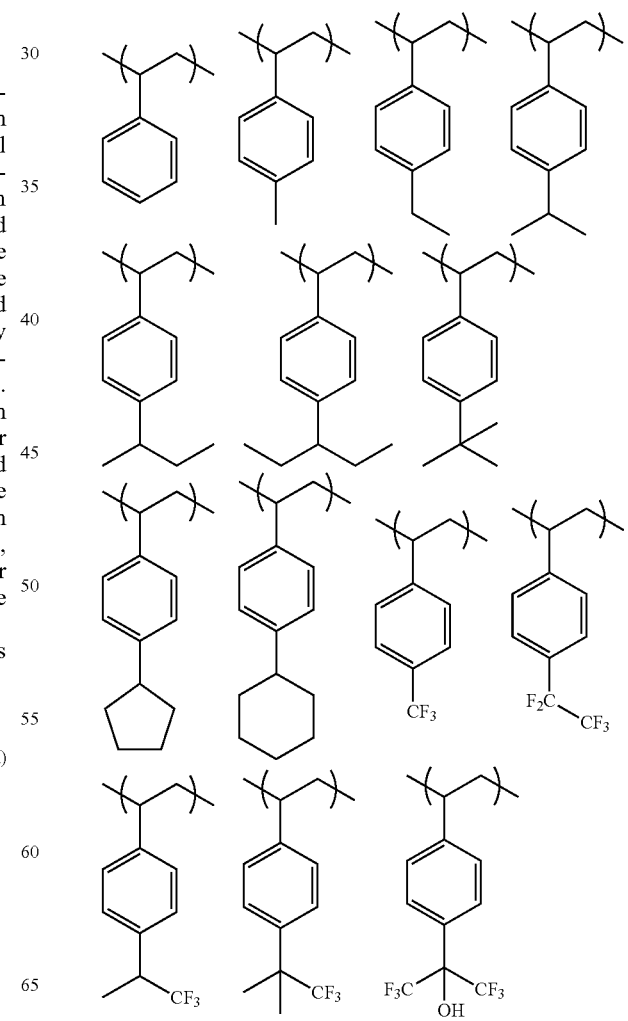

-continued
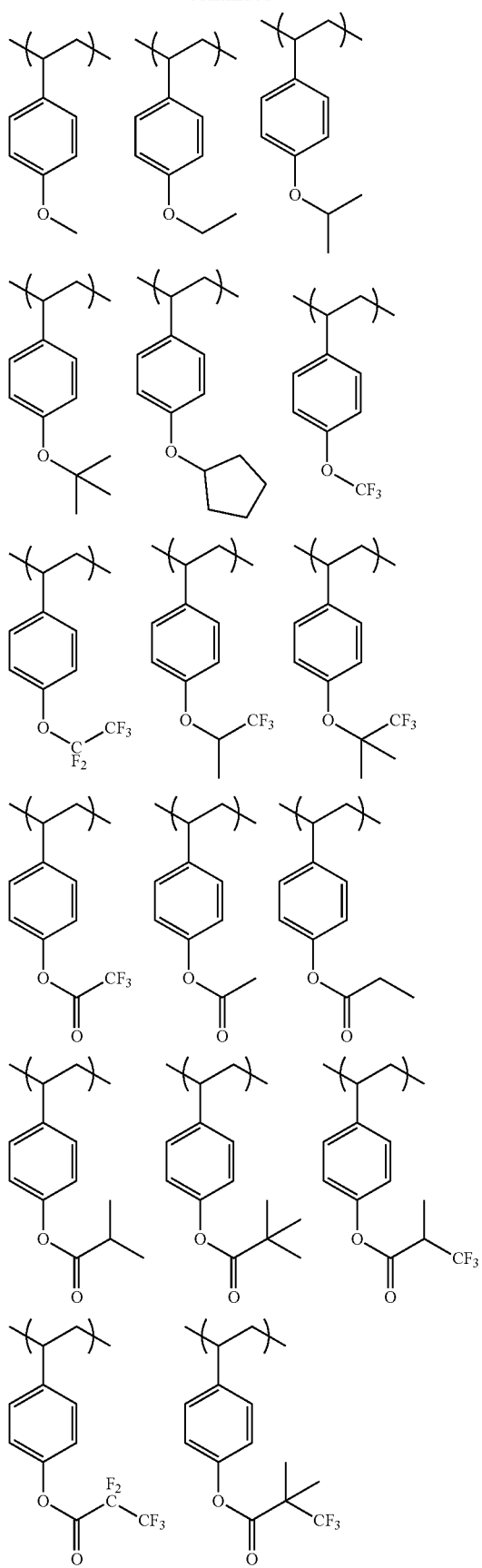
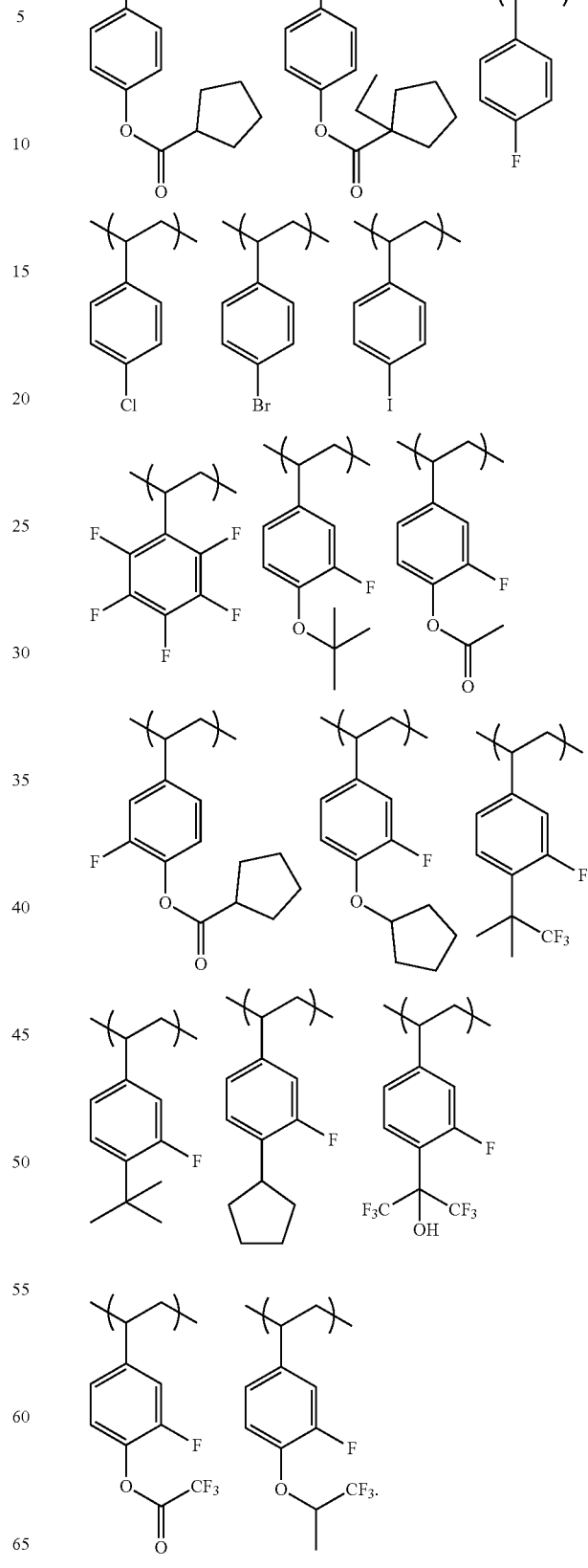

Suitable polymerized units of general formula (II) include, for example, the following:

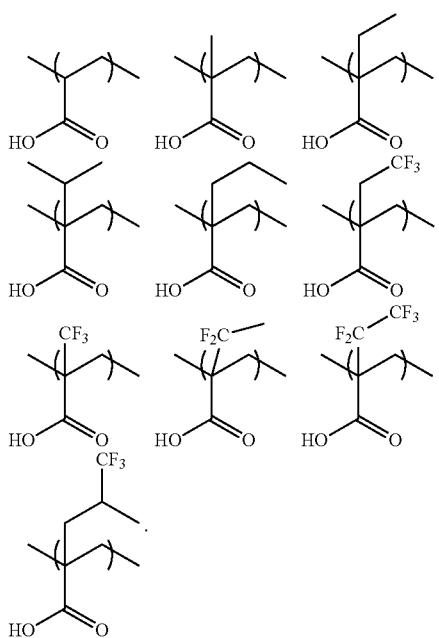

The polymer can include additional types of polymerized units. Suitable additional units can contain groups chosen, for example, from one or more of alkyl, hydroxy, fluoroalkyl, fluoroalcohol, ester, ether, imide, sulfonamide, acid such as sulfonic acid or carboxylic acid, or oxoalkanoate groups, and combinations thereof. Particularly preferred additional units include those of general formula (III):

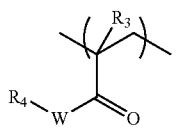
(III)

wherein $R_3$ represents hydrogen, a halogen atom, C1-C3 alkyl or C1-C3 fluoroalkyl, with hydrogen or methyl being typical. W represents O or NR, wherein R represents hydrogen or C1-C6 alkyl, typically C1-C3 alkyl; and $R_4$ represents substituted or unsubstituted C1-C20 alkyl, typically C1-C12 alkyl, or C1-C20 hetero alkyl, typically C1-C12 heteroalkyl. When included in the polymer, polymerized units of formula (III) are typically present in an amount from 5 to 20 mol %, based on total polymerized units of the polymer.

Suitable polymerized units of general formula (III) include, for example, the following:

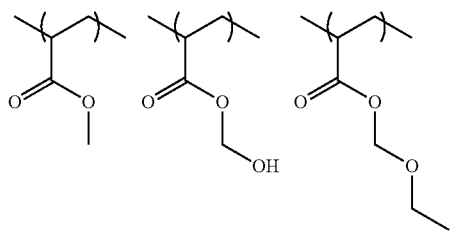

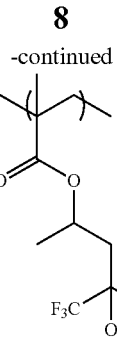

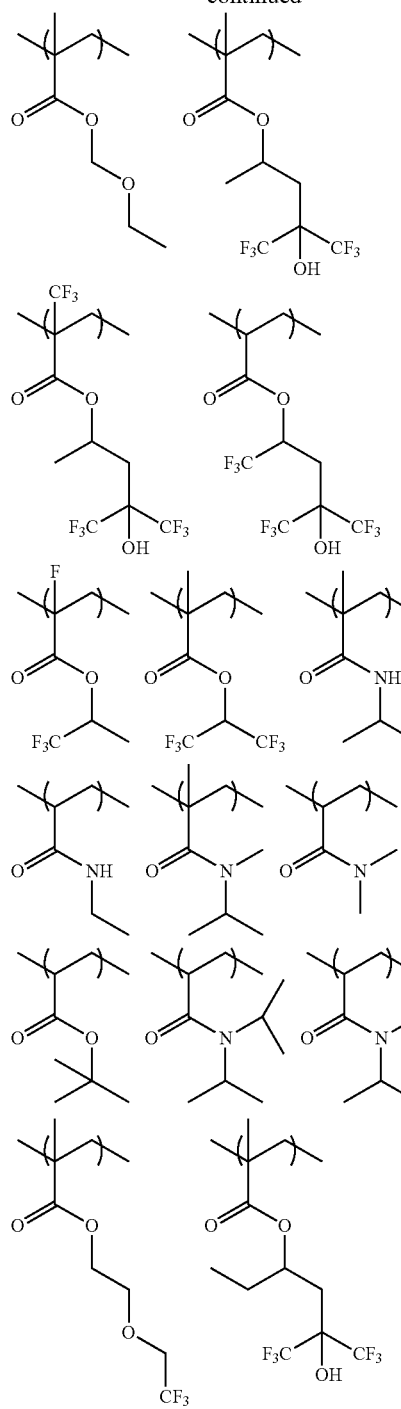

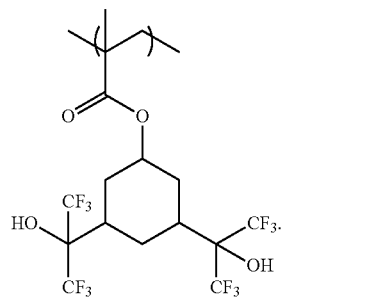

Other suitable additional polymerized units include, for example, the following:
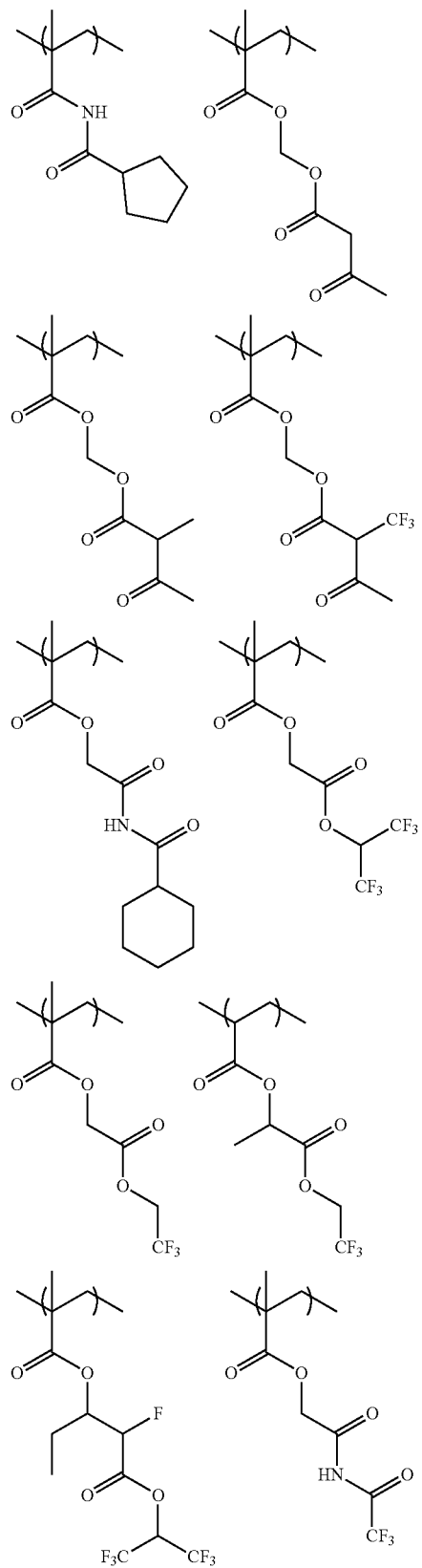
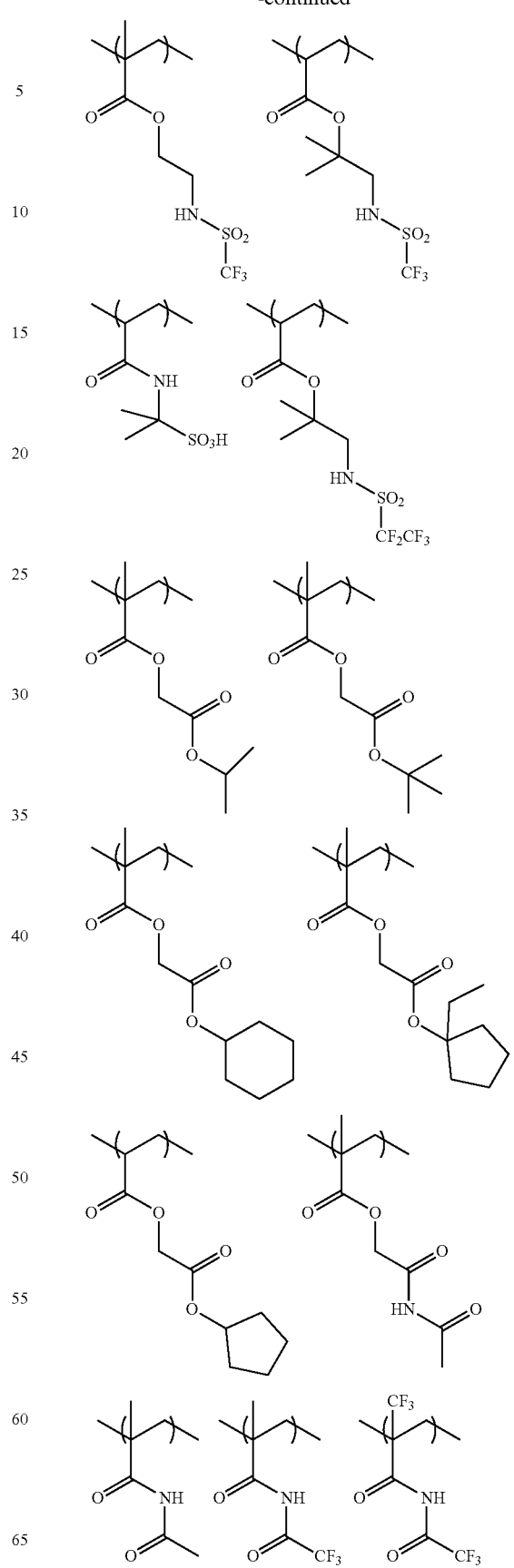

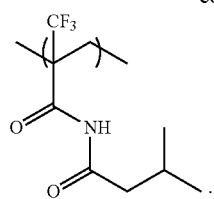
The content of additional polymerized units present in the polymer can vary widely, and is typically from 2 to 20 mol % based on total polymerized units of the polymer.
Suitable polymers in accordance with the invention include, for example, the following:
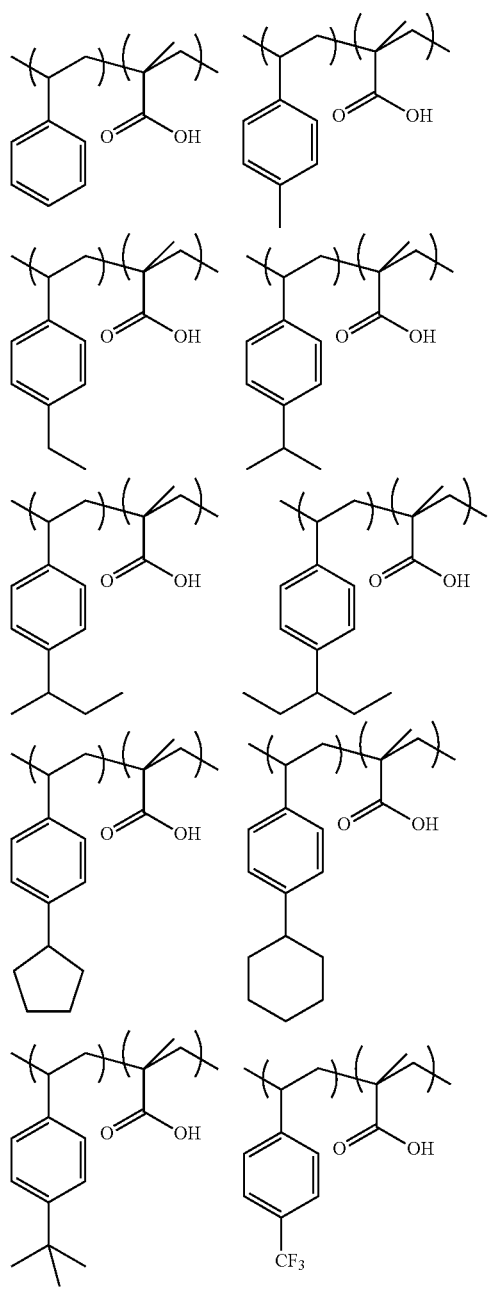
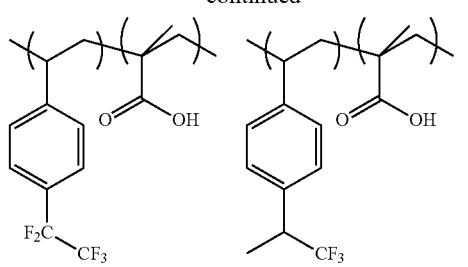
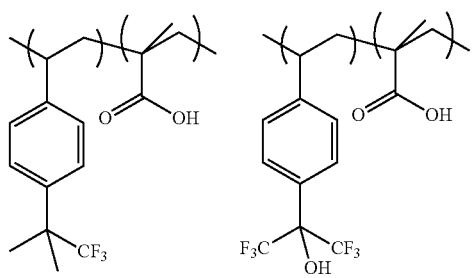
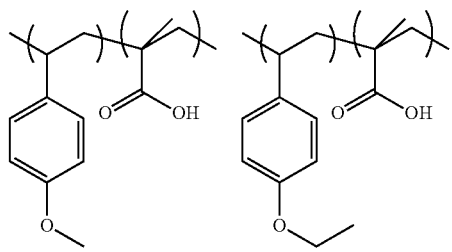
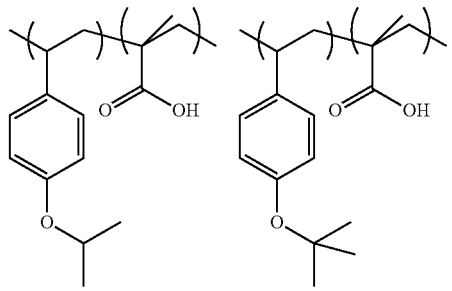
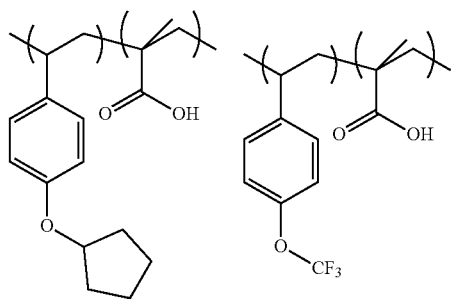
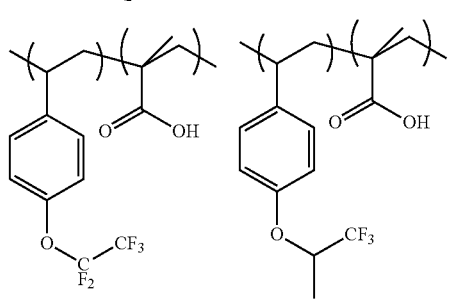

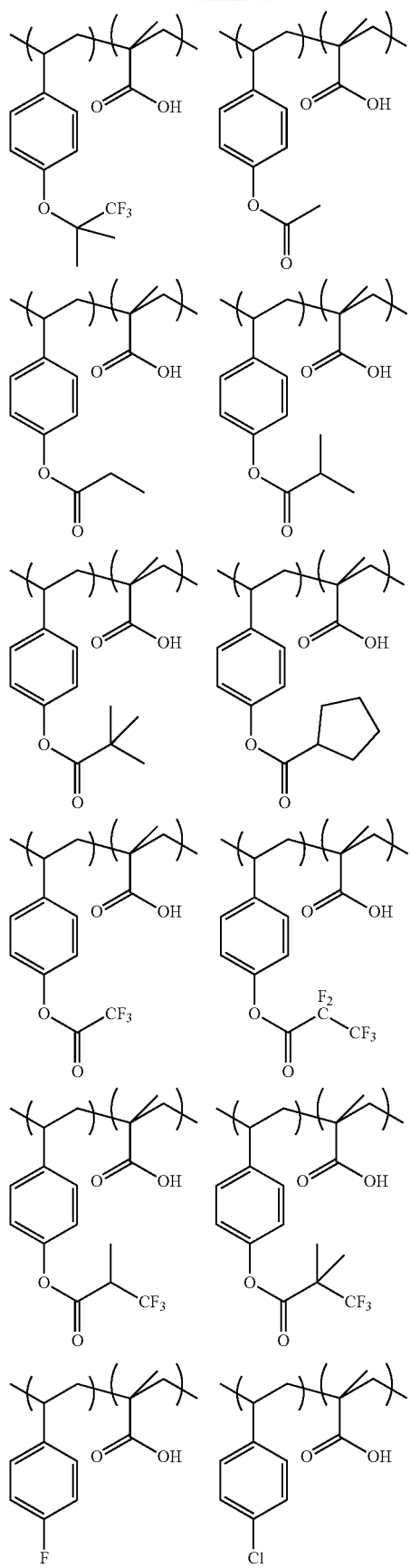
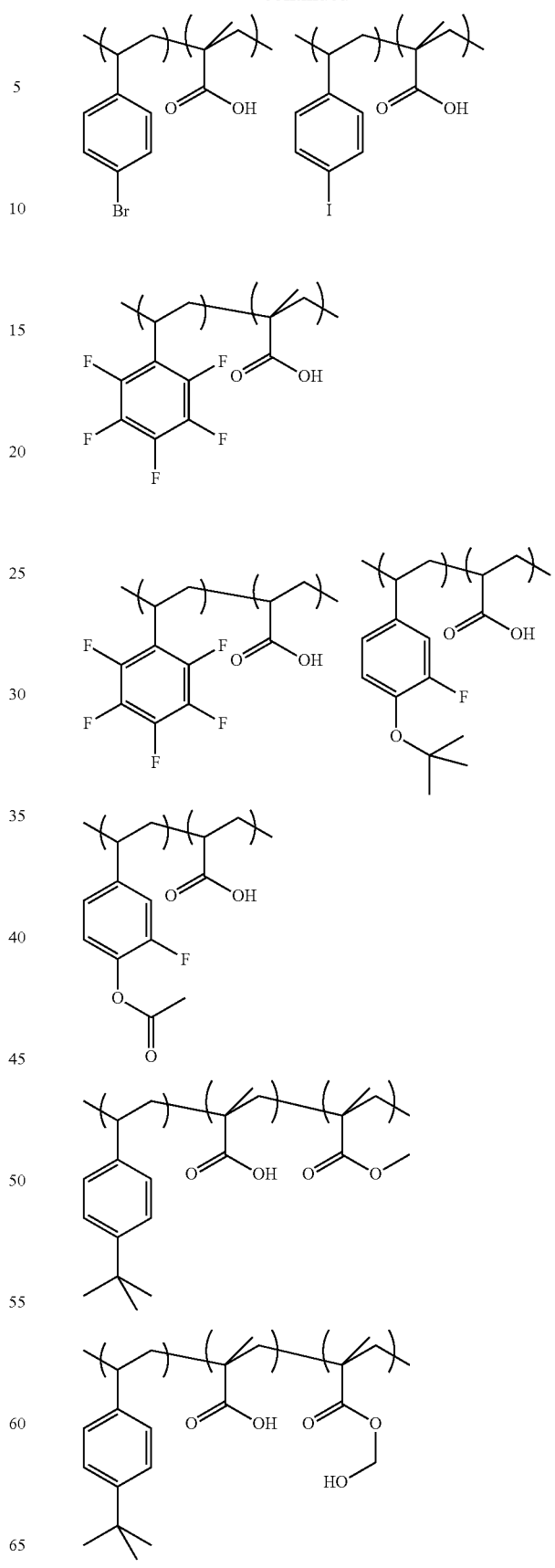

15
-continued
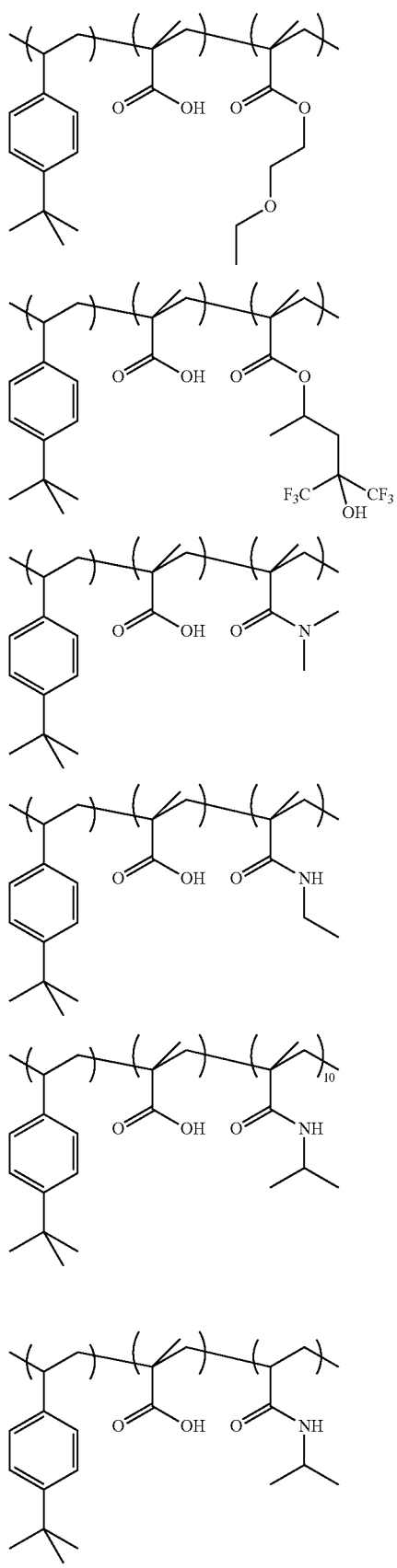
16
-continued
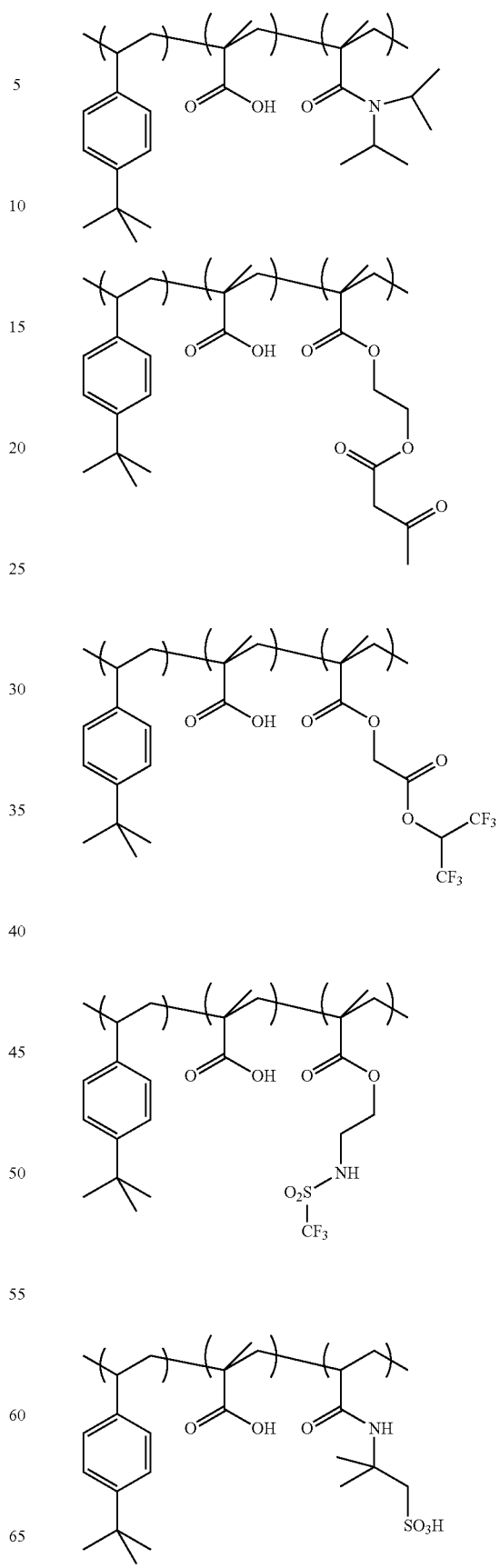

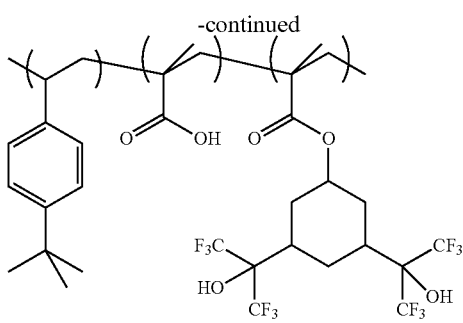

wherein the molar ratios of the various unit types are in the ranges described above.

The trimming compositions typically include a single polymer, but can optionally include one or more additional polymers. The content of the polymer in the composition will depend, for example, on the target thickness of the layer, with a higher polymer content being used when thicker layer is desired. The polymer is typically present in the pattern trimming composition in an amount of from 80 to 99.9 wt %, more typically from 90 to 99 wt %, or 95 to 99 wt %, based on total solids of the trimming composition. The weight average molecular weight (Mw) of the polymer is typically less than 400,000, preferably from 3000 to 50,000, more preferably from 3000 to 25,000, as measured by GPC versus polystyrene standards. Typically, the polymer will have a polydispersity index (PDI=Mw/Mn) of 3 or less, preferably 2 or less, as measured by GPC versus polystyrene standards.

Suitable polymers for use in the trimming compositions are commercially available and/or can readily be made by persons skilled in the art. For example, the polymer may be synthesized by dissolving selected monomers corresponding to units of the polymer in an organic solvent, adding a radical polymerization initiator thereto, and effecting heat polymerization to form the polymer. Examples of suitable organic solvents that can be used for polymerization of the polymer include, for example, toluene, benzene, tetrahydrofuran, diethyl ether, dioxane, ethyl lactate and methyl isobutyl carbinol. Suitable polymerization initiators include, for example, 2,2'-azobisisobutyronitrile (AIBN), 2,2'-azobis (2,4-dimethylvaleronitrile), dimethyl 2,2-azobis(2-methylpropionate), benzoyl peroxide and lauroyl peroxide.

The trimming compositions further include an aromatic sulfonic acid that is non-polymeric. In the case of a photoresist based on deprotection reaction, the acid with heat can cause cleavage of the bonds of acid labile groups in a surface region of the photoresist pattern, causing increased solubility of the photoresist polymer in a rinsing solution to be applied.

The aromatic sulfonic acid is of general formula (IV):

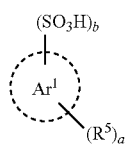

(IV)

wherein $Ar^1$ represents an aromatic group, which may be carbocyclic, heterocyclic, or a combination thereof. The aromatic group may be monocyclic, for example, phenyl or pyridyl, or polycyclic, for example biphenyl, and can include plural fused aromatic rings such as naphthyl, anthracenyl, pyrenyl or quinolinyl; or fused ring systems having both aromatic and non-aromatic rings such as 1,2,3,4-tetrahydronaphthalene, 9,10-dihydroanthracene or fluorene. A wide variety of aromatic groups may be used for $Ar^1$. The aromatic group typically has from 5 to 40 carbons, preferably from 6 to 35 carbons, and more preferably from 6 to 30 carbons. Suitable aromatic groups include, but are not limited to: phenyl, biphenyl, naphthalenyl, anthracenyl, phenanthrenyl, pyrenyl, tetracenyl, triphenylenyl, tetraphenyl, benzo[f]tetraphenyl, benzo[m]tetraphenyl, benzo[k]tetraphenyl, pentacenyl, perylenyl, benzo[a]pyrenyl, benzo[e]pyrenyl, benzo[ghi]perylenyl, coronenyl, quinolonyl, 7,8-benzoquinolinyl, fluorenyl, and 12H-dibenzo[b,h]fluorenyl. Of these, phenyl is particularly preferred. $R^5$ independently represents a halogen atom, hydroxy, substituted or unsubstituted alkyl, substituted or unsubstituted heteroalkyl, substituted or unsubstituted carbocyclic aryl, substituted or unsubstituted heterocyclic aryl, substituted or unsubstituted alkoxy, or a combination thereof. $R^5$ may also include one or more groups such as ester, carboxy, ether, or a combination thereof. a represents an integer of 0 or more and b represents an integer of 1 or more, provided that a+b is not greater than the total number of available aromatic carbon atoms of $Ar^1$. Preferably, two or more of $R^5$ are independently a fluorine atom or a fluoroalkyl group bonded directly to an aromatic ring carbon atom. The aromatic sulfonic acid is typically present in an amount of from about 0.01 to 20 wt % based on total solids of the trimming composition.

Preferably, the aromatic sulfonic acid is of general formula IV:

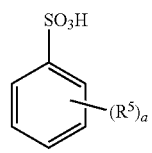

(V)

wherein: $R^5$ independently represents a halogen atom, hydroxy, substituted or unsubstituted alkyl, substituted or unsubstituted heteroalkyl, substituted or unsubstituted carbocyclic aryl, substituted or unsubstituted heterocyclic aryl, substituted or unsubstituted alkoxy, or a combination thereof, wherein adjacent $R^5$ groups together optionally form a fused ring with the aromatic group; a represents an integer of from 0 to 5. In a preferred aspect, two or more of $R^5$ are independently a fluorine atom or a fluoroalkyl group.

Suitable exemplary aromatic sulfonic acids include the following:

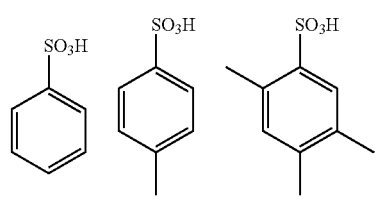

-continued
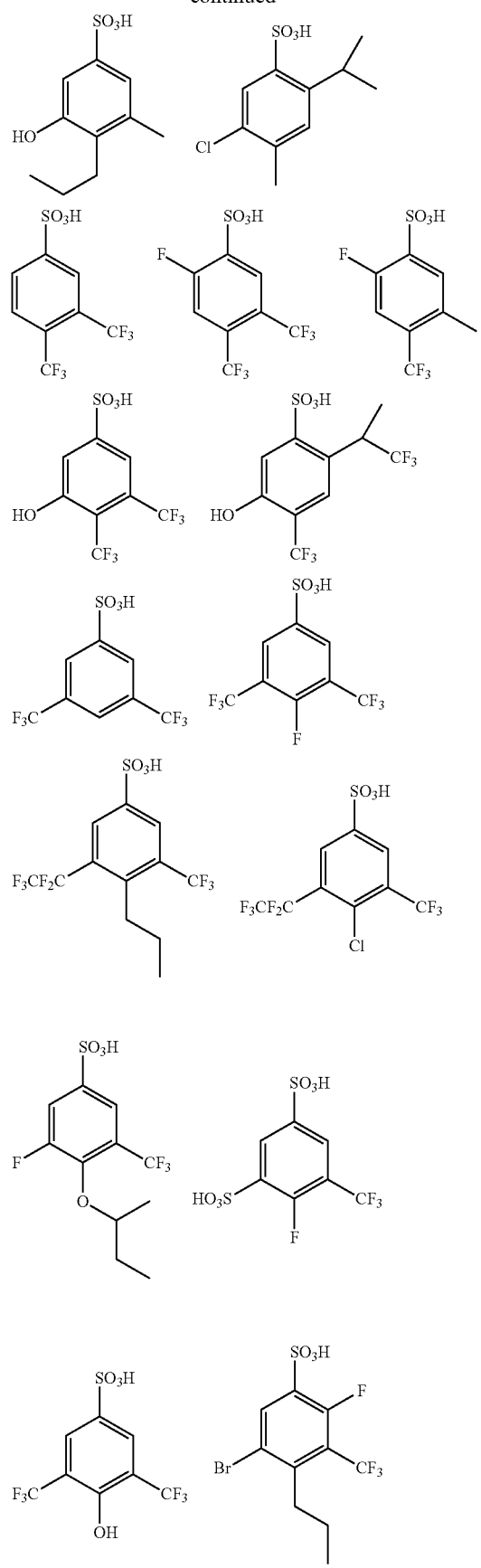
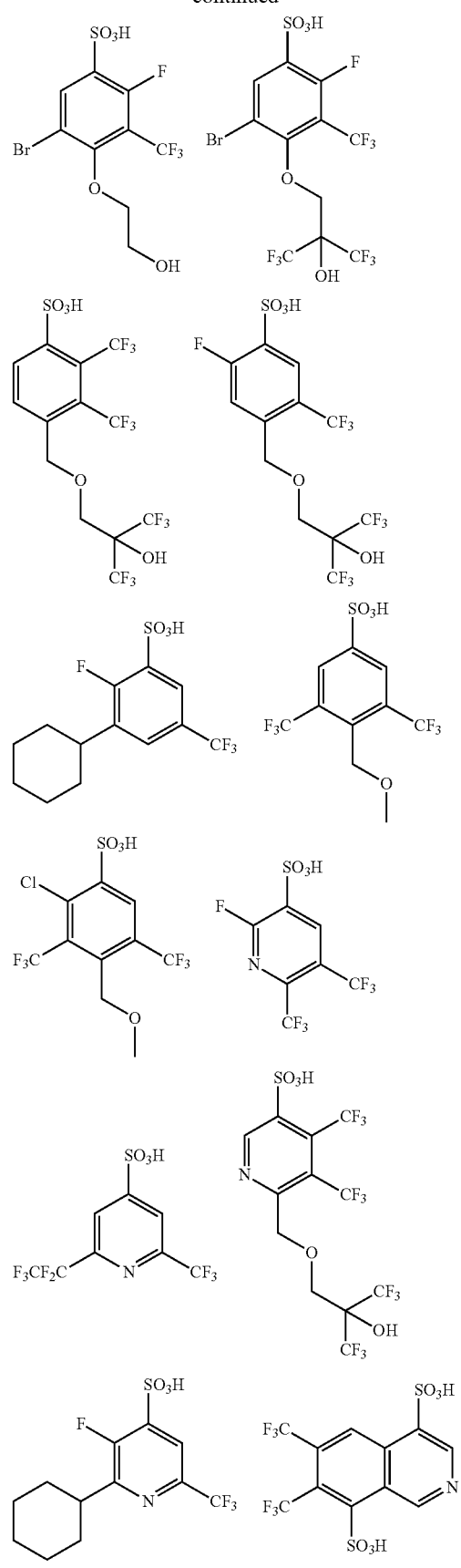

-continued
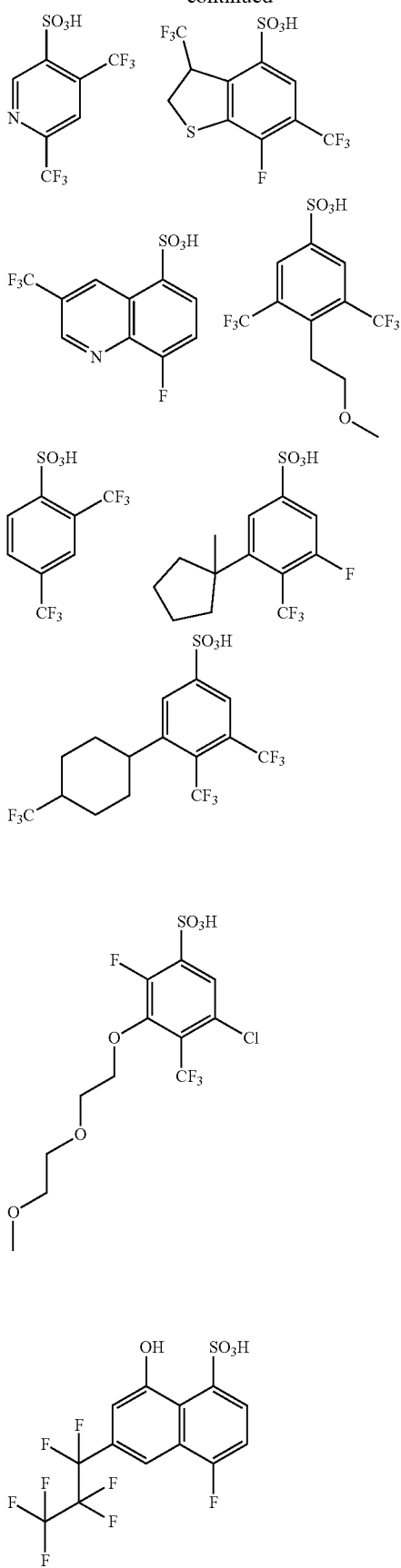
-continued
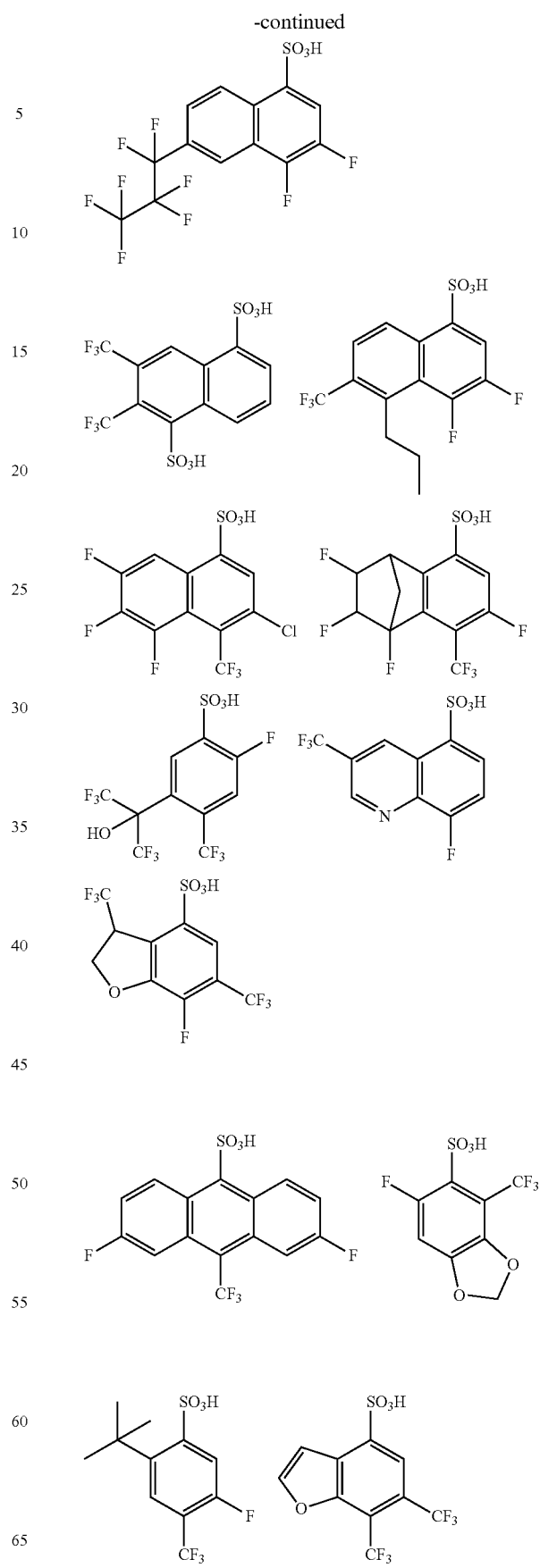

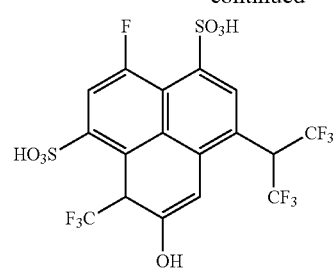
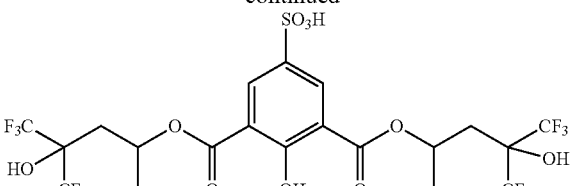
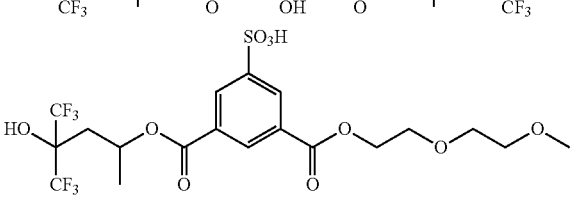
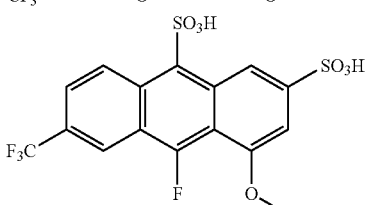
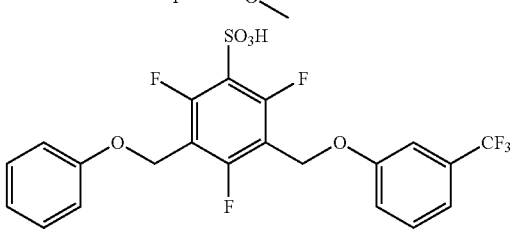
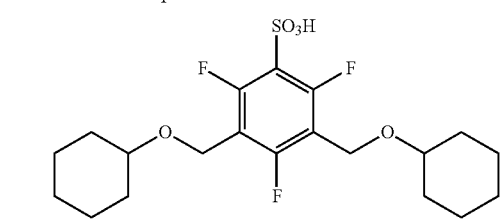
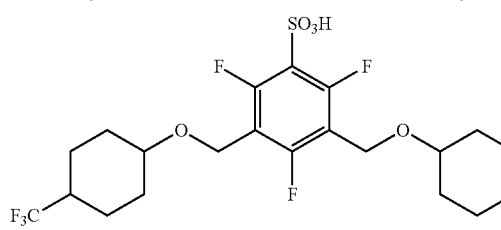
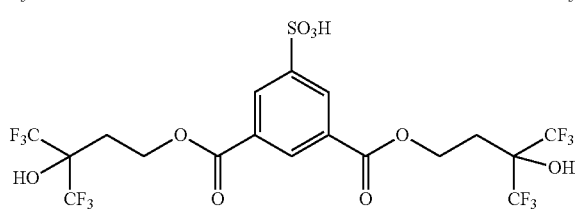
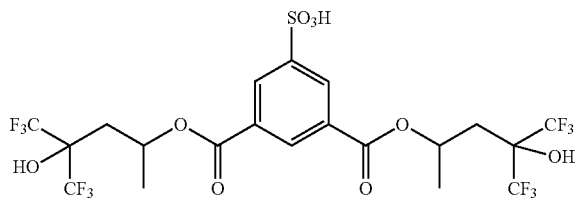
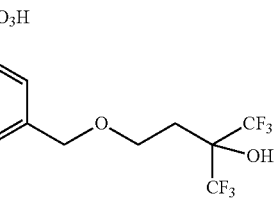
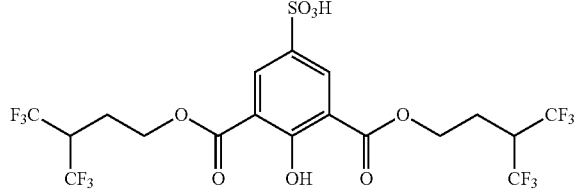
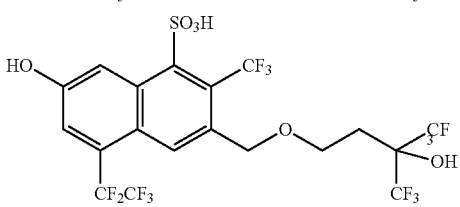
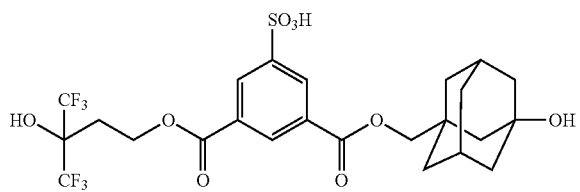

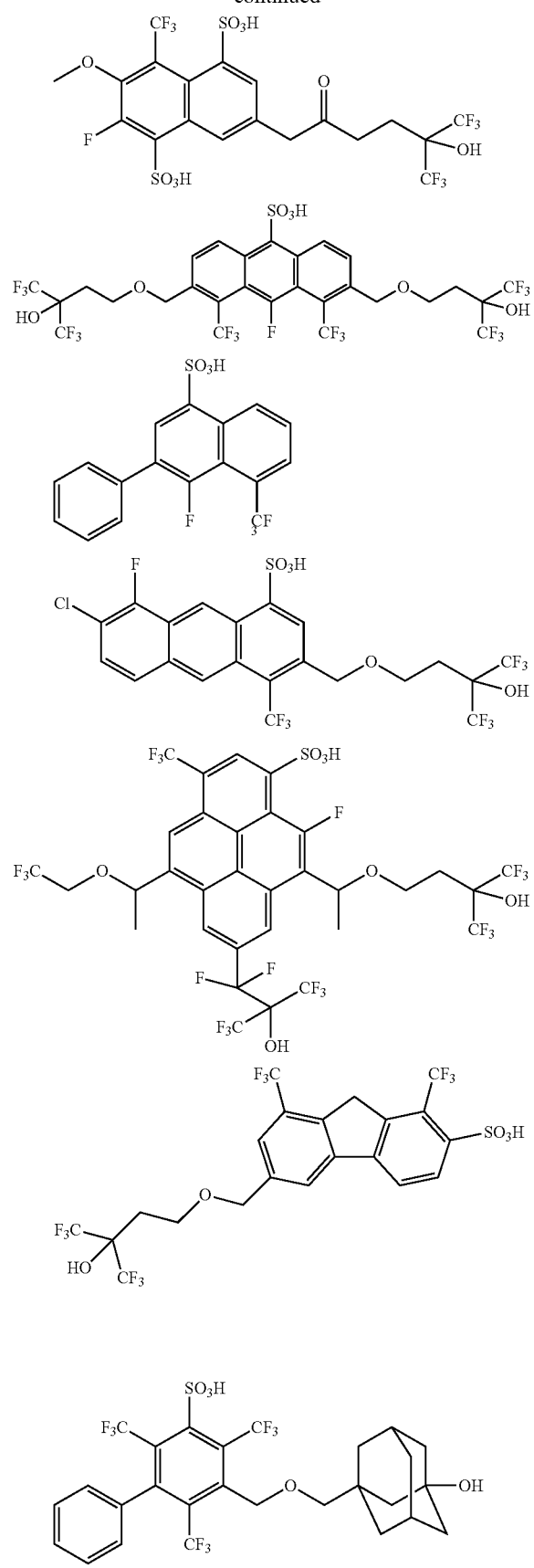

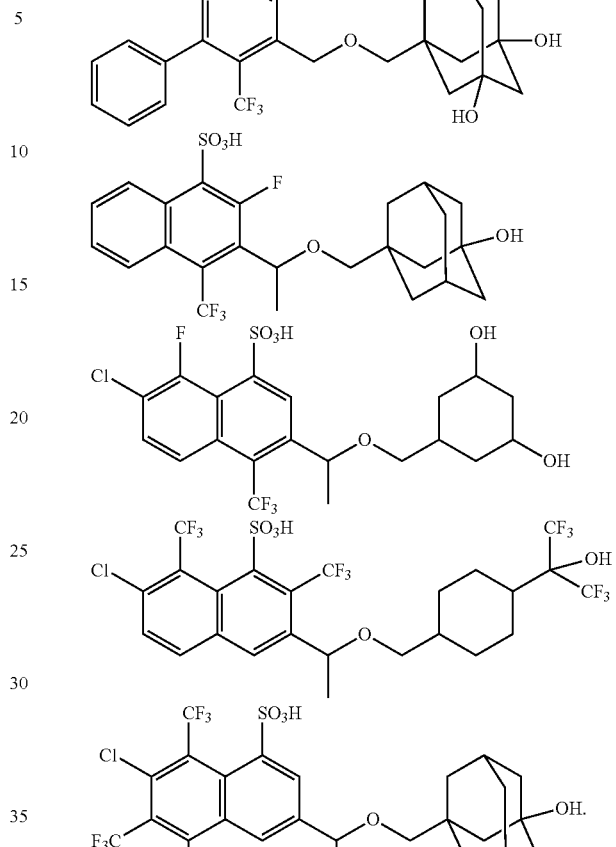

The trimming compositions further include an organic-based solvent system comprising one or more different solvents. The term "organic-based" means that the solvent system includes greater than 50 wt % organic solvent based on total solvents of the trimming composition, more typically greater than 90 wt %, greater than 95 wt %, greater than 99 wt % or 100 wt % organic solvents, based on total solvents of the trimming compositions. Suitable solvent materials to formulate and cast the trimming compositions should exhibit good solubility characteristics with respect to the non-solvent components of the trimming composition, without appreciably dissolving the underlying photoresist pattern, so as to minimize intermixing with the photoresist pattern.

Suitable organic solvents for the trimming composition include, for example: alkyl esters such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; alcohols such as straight, branched or cyclic $C_4$-$C_9$ monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; ethers such as isopentyl ether and dipropylene glycol monomethyl ether; and mixtures containing one or more of these solvents.

When the photoresist pattern to be trimmed is formed from a vinyl aromatic-based polymer, such as a polymer containing styrene- and/or hydroxystyrene-units, the solvent system preferably comprises one or more monoether solvents. Use of a monoether-based solvent system can provide low toploss characteristics when treating vinyl aromatic-based photoresist patterns. As used herein, "vinyl aromatic" means polymerized units formed from monomers in which an aromatic group is bonded directly to a vinyl group, for example, styrene, hydroxystyrene and vinyl naphthalene. "Vinyl aromatic-based polymer" means that the polymer contains greater than 50 mol % vinyl aromatic units based on total units of the polymer, more typically from 50 to 90 mol % or from 60 to 80 mol %, based on total units of the polymer.

Suitable monoether-containing solvent systems comprise one or more monoether solvents in a combined amount of from 50 to 98 wt %, preferably 70 to 98 wt %, 80 to 98 wt % or 90 to 98 wt %, based on the solvent system. Preferred monoether solvents include alkyl monoethers and aromatic monoethers, particularly preferred of which are those having a total carbon number of from 6 to 16. Suitable alkyl monoethers include, for example, 1,4-cineole, 1,8-cineole, pinene oxide, di-n-propyl ether, diisopropyl ether, di-n-butyl ether, di-n-pentyl ether, diisoamyl ether, dihexyl ether, diheptyl ether and dioctyl ether, with diisoamyl ether being preferred. Suitable aromatic monoethers include, for example, anisole, ethylbenzyl ether, diphenyl ether, dibenzyl ether and phenetole, with anisole being preferred.

The ether-containing solvent system preferably further includes one or more alcohol and/or ester solvents. For certain trimming compositions, an alcohol and/or ester solvent may provide enhanced solubility with respect to the solid components. Suitable alcohol solvents include, for example: straight, branched or cyclic C4-C8 monohydric alcohol such as 1-butanol, 2-butanol, isobutyl alcohol, tert-butyl alcohol, 3-methyl-1-butanol, 1-pentanol, 2-pentanol, 4-methyl-2-pentanol, 1-hexanol, 1-heptanol, 2-hexanol, 2-heptanol, 3-hexanol, 3-heptanol, 1-octanol, 2-octanol, 3-octanol, 4-octanol, 2,2,3,3,4,4-hexafluoro-1-butanol, 2,2,3,3,4,4,5,5-octafluoro-1-pentanol and 2,2,3,3,4,4,5,5,6,6-decafluoro-1-hexanol; and C5-C9 fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol. The alcohol solvent is preferably a C4-C8 monohydric alcohol, with 4-methyl-2-pentanol being preferred. Suitable ester solvents include, for example, alkyl esters having a total carbon number of from 4 to 10 such as alkyl propionates such as n-butyl propionate, n-pentyl propionate, n-hexyl propionate and n-heptyl propionate, and alkyl butyrates such as n-butyl butyrate, isobutyl butyrate and isobutyl isobutyrate. The one or more alcohol and/or ester solvents if used in the ether-containing solvent system are present in a combined amount of from 2 to 50 wt %, more typically in an amount of from 2 to 30 wt %, based on the solvent system.

The ether-containing solvent system can include one or more additional solvents chosen, for example, from one or more of: ketones such as 2,5-dimethyl-4-hexanone and 2,6-dimethyl-4-heptanone; aliphatic hydrocarbons such as n-heptane, 2-methylheptane, 3-methylheptane, 3,3-dimethylhexane, 2,3,4-trimethylpentane, n-octane, n-nonane, and n-decane; fluorinated aliphatic hydrocarbons such as perfluoroheptane; and diethers such as dipropylene glycol monomethyl ether. Such additional solvents, if used, are typically present in a combined amount of from 1 to 20 wt % based on the solvent system.

A particularly preferred organic-based solvent system includes one or more monoether solvents in a combined amount of from 70 to 98 wt % based on the solvent system, and one or more alcohol and/or ester solvents in a combined amount of from 2 to 30 wt % based on the solvent system. The one or more solvents making up the organic-based solvent system are typically present in the overcoat composition in a combined amount of from 90 to 99 wt %, preferably from 95 to 99 wt %, based on the overcoat composition.

The trimming composition can further include one or more additional, optional component, for example, a surfactant. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly (alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in McCutcheon's Emulsifiers and Detergents, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL® and DYNOL®. Additional suitable surfactants include other polymeric compounds such as the tri-block EO-PO-EO co-polymers PLURONIC® 25R2, L121, L123, L31, L81, L101 and P123 (BASF, Inc.). Such surfactant and other optional additives if used are typically present in the composition in minor amounts such as from 0.01 to 10 wt % based on total solids of the trimming composition. The trimming compositions are preferably free of cross-linking agents as such materials can result in a dimensional increase of the photoresist pattern. The trimming compositions can be free of polymeric acids and polymeric acid generators.

The trimming compositions can be prepared following known procedures. For example, the compositions can be prepared by dissolving solid components of the composition in the solvent components. The desired total solids content of the compositions will depend on factors such as the desired final layer thickness. Preferably, the solids content of the trimming compositions is from 1 to 10 wt %, more preferably from 1 to 5 wt %, based on the total weight of the composition.

Pattern Formation Methods

Processes in accordance with the invention will now be described with reference to FIG. 1A-H, which illustrates an exemplary process flow for a pattern formation method in accordance with the invention. While the illustrated process flow describes a patterning process in which a single resist mask is used to transfer the photoresist pattern to the underlying substrate, it should be clear that the method can be used in other lithographic processes, for example, in double patterning processes such as litho-litho-etch (LLE), litho-etch-litho-etch (LELE) or self-aligned double patterning (SADP), as an ion implantation mask, or any other lithographic process where such photoresist pattern treatment would be beneficial.

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD (PECVD), low-pressure CVD (LPCVD) or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer 103 and/or a bottom antireflective coating (BARC) 104 over which a photoresist layer 106 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer 103 which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, spin-on-carbon (SOC), silicon oxynitride and silicon nitride. The hard mask layer can include a single layer or a plurality of layers of different materials. The hard mask layer can be formed, for example, by CVD, PVD, or spin-coating techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet radiation (300 nm or less), for example, KrF (248 nm), ArF (193 nm) or EUV (13.5 nm) radiation. The antireflective coating can comprise a single layer or a plurality of different layers. Suitable antireflective materials and methods of formation are known in the art. Antireflective materials are commercially available, for example, those sold under the AR™ tradename by DuPont (Wilmington, Del. USA), such as AR™3 AR™ 40A and AR™124 antireflectant materials.

A photoresist layer 106 is formed from a photoresist composition, typically a chemically amplified photosensitive composition comprising a polymer having acid labile groups, a photoacid generator and a solvent. Suitable photoresist compositions are well known in the art. Preferably, the photoresist polymers are formed from monomers chosen from vinyl aromatic (e.g., styrene and hydroxystyrene), (meth)acrylate, norbornene, and combinations thereof. In a preferred aspect, the photoresist polymer is vinyl aromatic-based, wherein more than 50 mol % of the polymerized units in the polymer, typically more than 80 mol % of the polymerized units in the polymer, are formed from vinyl aromatic monomers.

The photoresist layer is disposed on the substrate over the antireflective layer 104 (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 106 is from about 500 to 3000 Å.

The photoresist layer 106 is typically next softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 106 is next exposed to activating radiation 108 through a photomask 110 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to be exposed and unexposed, respectively, by the activating radiation. The exposure wavelength is typically sub-400 nm, sub-300 nm, such as deep-UV (248 nm), 193 nm or an EUV wavelength (e.g., 13.5 nm). In a preferred aspect, the exposure wavelength is deep-UV or EUV lithography. The exposure energy is typically from about 10 to 80 mJ/cm$^2$, depending, for example, on the exposure tool and the components of the photosensitive composition.

Following exposure of the photoresist layer 106, a post-exposure bake (PEB) is typically performed. The PEB can be conducted, for example, on a hotplate or in an oven.

Conditions for the PEB will depend, for example, on the particular photoresist composition and layer thickness. The PEB is typically conducted at a temperature of from about 80 to 150° C., and a time of from about 30 to 90 seconds. A latent image defined by the boundary between polarity-switched and unswitched regions (corresponding to exposed and unexposed regions, respectively) is thereby formed.

Figure 1E:
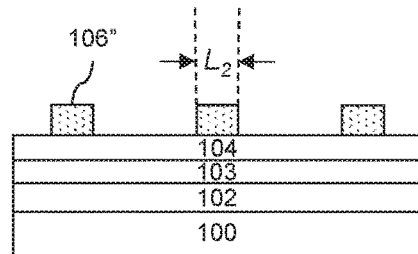
Figure 1B:
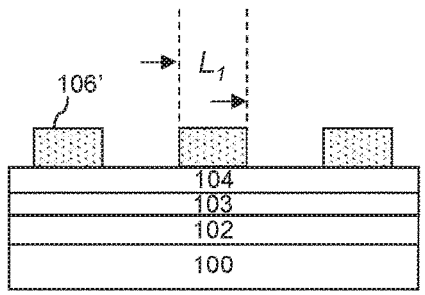

The photoresist layer 106 is next developed to remove exposed regions of the layer, leaving unexposed regions forming a resist pattern 106' having a plurality of features as shown in FIG. 1B. The features are not limited and can include, for example, a plurality of lines, pillars and/or contact hole patterns which allow for the formation of such patterns in the underlying layers to be patterned. The formed resist patterns have an initial dimension shown as $L_1$, a linewidth for line patterns, post diameter for post patterns, or sidewall width for contact hole patterns.

Figure 1F:
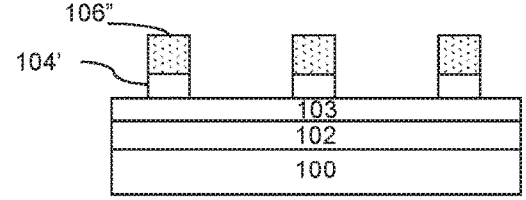
Figure 1C:
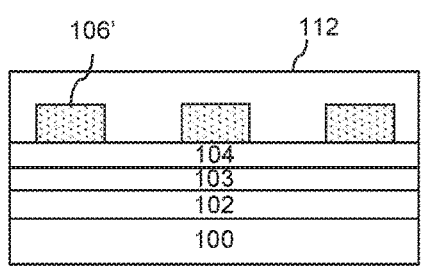

A layer 112 of a photoresist pattern trimming composition as described herein is formed over the photoresist pattern 106' as shown in FIG. 1C. The trimming composition is typically applied to the substrate by spin-coating. The solids content of the coating solution can be adjusted to provide a desired film thickness based upon the specific coating equipment utilized, the viscosity of the solution, the speed of the coating tool and the amount of time allowed for spinning. A typical thickness for the pattern trimming composition layer 112 is from 200 to 1500 Å, typically measured on an unpatterned substrate.

Figure 1G:
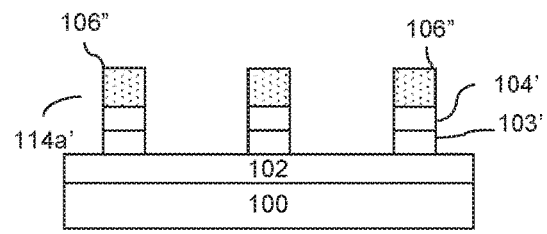
Figure 1D:
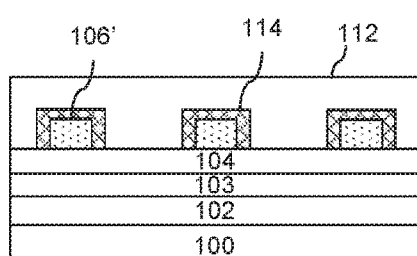

As shown in FIG. 1D, the substrate is next baked to remove solvent in the trimming composition layer. The bake also allows the acid of the trimming composition to diffuse into the surface of the resist pattern 106' to cause a polarity-changing reaction in the resist pattern surface region 114. The bake can be conducted with a hotplate or oven, with a hotplate being typical. Suitable bake temperatures are greater than 50° C., for example, greater than 70° C., greater than 90° C., greater than 120° C. or greater than 150° C., with a temperature of from 70 to 160° C. and a time of from about 30 to 90 seconds being typical. While a single baking step is typical, multiple-step baking can be used and may be useful for resist profile adjustment.

The photoresist pattern is next contacted with a rinsing agent, typically a developing solution, to remove the residual trimming composition layer 112 and typically also the surface region 114 of the photoresist pattern, with the resulting pattern 106" being shown in FIG. 1E. The rinsing agent is typically an aqueous alkaline developer, for example, a quaternary ammonium hydroxide solution, for example, a tetra-alkyl ammonium hydroxide solution such as 0.26 Normality (N) (2.38 wt %) tetramethylammonium hydroxide (TMAH). The rinsing agent can further be or comprise water. The resulting structure is shown in FIG. 1E. The resist pattern after trimming treatment has a dimension ($L_2$) that is smaller as compared with the feature size prior to trimming treatment.

Figure 1H:
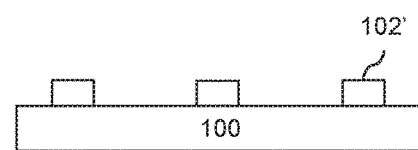

Using the resist pattern 106" as an etch mask, the BARC layer 104 is selectively etched to form BARC patterns 104', exposing the underlying hardmask layer 103, as shown in FIG. 1F. The hardmask layer is next selectively etched, again using the resist pattern as an etch mask, resulting in patterned BARC and hardmask layer 103', as shown in FIG. 1G. Suitable etching techniques and chemistries for etching the BARC layer and hardmask layer are known in the art and will depend, for example, on the particular materials of these layers. Dry-etching processes such as reactive ion etching are typical. The resist pattern 106" and patterned BARC layer 104' are next removed from the substrate using known techniques, for example, oxygen plasma ashing. Using the hardmask pattern 103' as an etch mask, the one or more layers 102 are then selectively etched. Suitable etching techniques and chemistries for etching the underlying layers 102 are known in the art, with dry-etching processes such as reactive ion etching being typical. The patterned hardmask layer 103' can next be removed from the substrate surface using known techniques, for example, a dry-etching process such as reactive ion etching or a wet strip. The resulting structure is a pattern of etched features 102' as illustrated in FIG. 1H. In an alternative exemplary method, it may be desirable to pattern the layer 102 directly using the photoresist pattern 106" without the use of a hardmask layer 103. Whether direct patterning with the resist patterns can be employed will depend on factors such as the materials involved, resist selectivity, resist pattern thickness and pattern dimensions.

The following non-limiting examples are illustrative of the invention.

EXAMPLES

Polymer Synthesis

The following monomers were used to synthesize polymers according to the procedures described below:

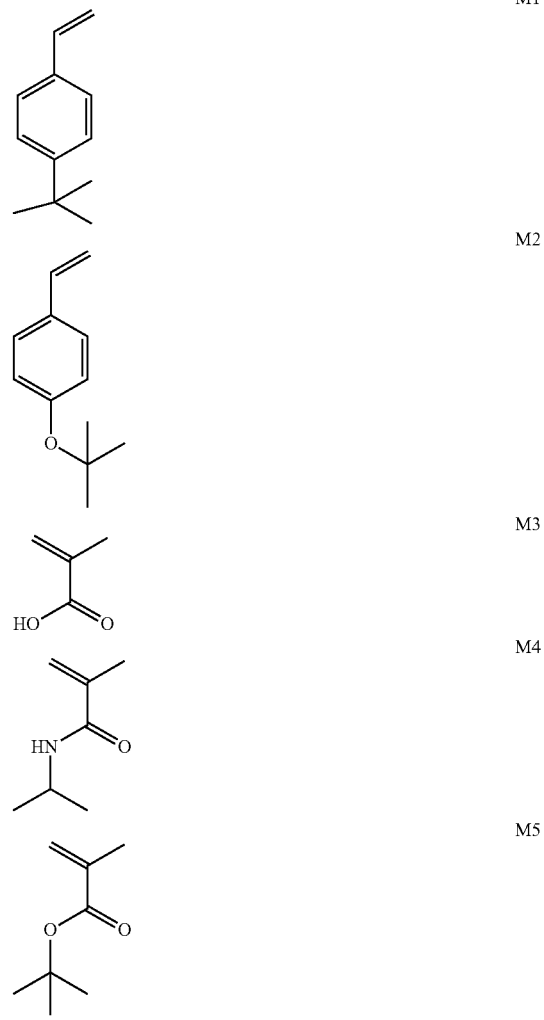

-continued

M6
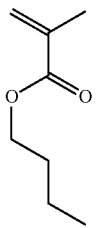

M7
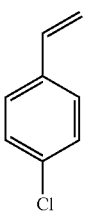

M8
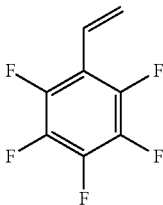

M9
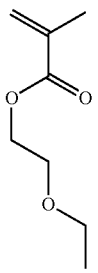

M10
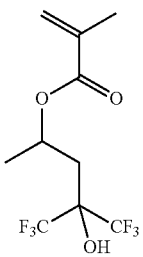

Example 1 (Polymer P1)

A monomer feed solution was prepared by dissolving 14.54 g Monomer M1 and 5.11 g Monomer M3 in 131.06 g ethyl lactate, and the solution was heated to 165° C. An initiator feed solution was prepared by combining 1.25 g V-601 free radical initiator (Wako Chemical Company) and 58.04 g ethyl lactate in a container and agitating the mixture to dissolve the initiator. The initiator feed solution was fed to the reaction vessel over a period of 2 hours. The reaction vessel was maintained at 165° C. for an additional 24 hours with agitation, and was then allowed to cool to room temperature. The reaction mixture was precipitated from methanol:water 75/25 (wt %) (20×) to yield Polymer P1 as white solids (14 g, 74% yield). Weight average molecular weight (Mw) and number average molecular weight (Mn) were determined for this and subsequent examples by polystyrene equivalent value as measured by gel permeation chromatography (GPC), and polydispersity was calculated as PDI=Mw/Mn. The monomer ratios in the polymer and molecular weight results for this and subsequent examples are shown in Table 1.

Example 2 (Polymer P2)

A monomer feed solution was prepared by dissolving 13.81 g Monomer M1 and 7.44 g Monomer M3 in 190.97 g ethyl lactate, and the solution was heated to 165° C. An initiator feed solution was prepared by combining 4.30 g V-601 free radical initiator (Wako Chemical Company) and 43.50 g ethyl lactate in a container and agitating the mixture to dissolve the initiator. The initiator feed solution was fed to the reaction vessel over a period of 0.5 hours. The reaction vessel was maintained at 165° C. for an additional 24 hours with agitation, and was then allowed to cool to room temperature. The reaction mixture was precipitated from methanol:water 75/25 (wt %) (20×) to yield Polymer P2 as white solids (18 g, 85% yield).

Example 3 (Polymer P3)

A monomer feed solution was prepared by dissolving 11.98 g Monomer M1, 5.13 g Monomer M3 and 1.90 g Monomer M4 in 108 g ethyl lactate, and the solution was heated to 165° C. An initiator feed solution was prepared by combining 1.52 g V-601 free radical initiator (Wako Chemical Company) and 70.00 g ethyl lactate in a container and agitating the mixture to dissolve the initiator. The initiator feed solution was fed to the reaction vessel over a period of 0.5 hours. The reaction vessel was maintained at 165° C. for an additional 24 hours with agitation, and was then allowed to cool to room temperature. The reaction mixture was precipitated from methanol:water 75/25 (wt %) (20×) to yield Polymer P3 as white solids (15 g, 79% yield).

Example 4 (Polymer P4)

A monomer feed solution was prepared by dissolving 14.62 g Monomer M1, 7.87 g Monomer M3 and 2.58 g Monomer M4 in 220.00 g ethyl lactate, and the solution was heated to 165° C. An initiator feed solution was prepared by combining 4.81 g V-601 free radical initiator (Wako Chemical Company) and 55.00 g ethyl lactate in a container and agitating the mixture to dissolve the initiator. The initiator feed solution was fed to the reaction vessel over a period of 0.5 hours. The reaction vessel was maintained at 165° C. for an additional 24 hours with agitation, and was then allowed to cool to room temperature. The reaction mixture was precipitated from methanol:water 80/20 (wt %) (20×) to yield Polymer P4 as white solids (21 g, 84% yield).

Example 5 (Polymer P5)

A monomer feed solution was prepared by dissolving 10.16 g Monomer M1, 6.82 g Monomer M3 and 2.02 g Monomer M4 in 72 g ethyl lactate, and the solution was heated to 165° C. An initiator feed solution was prepared by combining 2.28 g V-601 free radical initiator (Wako Chemical Company) and 106.00 g ethyl lactate in a container and agitating the mixture to dissolve the initiator. The initiator feed solution was fed to the reaction vessel over a period of 2 hours. The reaction vessel was maintained at 165° C. for an additional 24 hours with agitation, and was then allowed to cool to room temperature. The reaction mixture was precipitated from methanol:water 75/25 (wt %) (20×) to yield Polymer P5 as white solids (17 g, 89% yield).

Example 6 (Polymer P6)

A monomer feed solution was prepared by dissolving 14.35 g Monomer M2 and 4.66 g Monomer M3 in 127 g ethyl lactate, and the solution was heated to 165° C. An initiator feed solution was prepared by combining 1.25 g V-601 free radical initiator (Wako Chemical Company) and 58.00 g ethyl lactate in a container and agitating the mixture to dissolve the initiator. The initiator feed solution was fed to the reaction vessel over a period of two hours. The reaction vessel was maintained at 165° C. for an additional 24 hours with agitation, and was then allowed to cool to room temperature. The reaction mixture was precipitated from methanol:water 75/25 (wt %) (20×) to yield Polymer P6 as white solids (15 g, 79% yield).

Example 7 (Polymer P7)

A monomer feed solution was prepared by dissolving 17.80 g Monomer M2 and 7.27 g Monomer M3 in 225.00 g ethyl lactate, and the solution was heated to 165° C. An initiator feed solution was prepared by combining 4.91 g V-601 free radical initiator (Wako Chemical Company) and 50.00 g ethyl lactate in a container and agitating the mixture to dissolve the initiator. The initiator feed solution was fed to the reaction vessel over a period of 0.5 hours. The reaction vessel was maintained at 165° C. for an additional 24 hours with agitation, and was then allowed to cool to room temperature. The reaction mixture was precipitated from methanol:water 75/25 (wt %) (20×) to yield Polymer P7 as white solids (21 g, 84% yield).

Example 8 (Polymer P8)

A monomer feed solution was prepared by dissolving 12.35 g Monomer M2, 1.81 g Monomer M3 and 4.85 g Monomer M4 in 86.00 g ethyl lactate, and the solution was heated to 165° C. An initiator feed solution was prepared by combining 2.21 g V-601 free radical initiator (Wako Chemical Company) and 102.80 g ethyl lactate in a container and agitating the mixture to dissolve the initiator. The initiator feed solution was fed to the reaction vessel over a period of 2 hours. The reaction vessel was maintained at 165° C. for an additional 24 hours with agitation, and was then allowed to cool to room temperature. The reaction mixture was precipitated from methanol:water 70/30 (wt %) (20×) to yield Polymer P8 as white solids (15.5 g, 81% yield).

Example 9 (Polymer P9)

A monomer feed solution was prepared by dissolving 12.35 g Monomer M2, 1.81 g Monomer M3 and 4.85 g Monomer M4 in 130 g ethyl lactate, and the solution was heated to 165° C. An initiator feed solution was prepared by combining 2.52 g V-601 free radical initiator (Wako Chemical Company) and 50.00 g ethyl lactate in a container and agitating the mixture to dissolve the initiator. The initiator feed solution was fed to the reaction vessel over a period of 2 hours. The reaction vessel was maintained at 165° C. for an additional 24 hours with agitation, and was then allowed to cool to room temperature. The reaction mixture was precipitated from methanol:water 75/25 (wt %) (20×) to yield Polymer P9 as white solids (17 g, 89% yield).

Example 10 (Polymer P10)

A monomer feed solution was prepared by dissolving 11.60 g Monomer M2, 1.85 g Monomer M3 and 5.56 g Monomer M4 in 130 g ethyl lactate, and the solution was heated to 165° C. An initiator feed solution was prepared by combining 2.73 g V-601 free radical initiator (Wako Chemical Company) and 58.00 g ethyl lactate in a container and agitating the mixture to dissolve the initiator. The initiator feed solution was fed to the reaction vessel over a period of 2 hours. The reaction vessel was maintained at 165° C. for an additional 24 hours with agitation, and was then allowed to cool to room temperature. The reaction mixture was precipitated from methanol:water 75/25 (wt %) (20×) to yield Polymer P10 as white solids (14.5 g, 76% yield).

Example 11 (Polymer P11)

A monomer feed solution was prepared by dissolving 10.64 g Monomer M2, 1.94 g Monomer M3 and 6.46 g Monomer M4 in 140 g ethyl lactate, and the solution was heated to 165° C. An initiator feed solution was prepared by combining 3.27 g V-601 free radical initiator (Wako Chemical Company) and 38.00 g ethyl lactate in a container and agitating the mixture to dissolve the initiator. The initiator feed solution was fed to the reaction vessel over a period of 2 hours. The reaction vessel was maintained at 165° C. for an additional 24 hours with agitation, and was then allowed to cool to room temperature. The reaction mixture was precipitated from methanol:water 75/25 (wt %) (20×) to yield Polymer P11 as white solids (15 g, 79% yield).

Example 12 (Polymer P12)

A monomer feed solution was prepared by dissolving 12.03 g Monomer M7 and 4.97 g Monomer M3 in 152 g ethyl lactate, and the solution was heated to 165° C. An initiator feed solution was prepared by combining 2.72 g V-601 free radical initiator (Wako Chemical Company) and 27.50 g ethyl lactate in a container and agitating the mixture to dissolve the initiator. The initiator feed solution was fed to the reaction vessel over a period of 0.5 hours. The reaction vessel was maintained at 165° C. for an additional 24 hours with agitation, and was then allowed to cool to room temperature. The reaction mixture was precipitated from methanol:water 75/25 (wt %) (20×) to yield Polymer P12 as white solids (13 g, 76% yield).

Example 13 (Polymer P13)

A monomer feed solution was prepared by dissolving 13.12 g Monomer M8 and 3.88 g Monomer M3 in 152 g ethyl lactate, and the solution was heated to 165° C. An initiator feed solution was prepared by combining 2.72 g V-601 free radical initiator (Wako Chemical Company) and 30.00 g ethyl lactate in a container and agitating the mixture to dissolve the initiator. The initiator feed solution was fed to the reaction vessel over a period of 0.5 hours. The reaction vessel was maintained at 165° C. for an additional 24 hours with agitation, and was then allowed to cool to room temperature. The reaction mixture was precipitated from methanol:water 75/25 (wt %) (20×) to yield Polymer P13 as white solids (12 g, 70% yield).

Example 14 (Polymer P14)

A monomer feed solution was prepared by dissolving 11 g Monomer M1, 7.44 g Monomer M3 and 2.72 g Monomer M9 and in 190 g ethyl lactate in a reaction vessel, and the solution was heated to 165° C. An initiator feed solution was prepared by combining 3.40 g V-601 free radical initiator (Wako Chemical Company) and 34.40 g ethyl lactate in a container and agitating the mixture to dissolve the initiator. The initiator feed solution was fed to the reaction vessel over a period of 0.5 hour. The reaction vessel was maintained at 165° C. for an additional 24 hours with agitation, and was then allowed to cool to room temperature. The reaction mixture was precipitated from methanol:water 75/25 (wt %) (20×) to yield Polymer P14 as white solids (18 g, 86%).

Example 15 (Polymer P15)

A monomer feed solution was prepared by dissolving 10.92 g Monomer M1, 5.87 g Monomer M3 and 4.46 g Monomer M10 in 190 g ethyl lactate, and the solution was heated to 165° C. An initiator feed solution was prepared by combining 3.40 g V-601 free radical initiator (Wako Chemical Company) and 35.00 g ethyl lactate in a container and agitating the mixture to dissolve the initiator. The initiator feed solution was fed to the reaction vessel over a period of 0.5 hours. The reaction vessel was maintained at 165° C. for an additional 24 hours with agitation, and was then allowed to cool to room temperature. The reaction mixture was precipitated from methanol:water 60/40 (wt %) (20×) to yield Polymer P15 as white solids (17 g, 81% yield).

Example 16 (Polymer CP1)

A feed solution was prepared by combining 18.60 g propylene glycol monomethyl ether (PGME), 22.19 g monomer M5, 22.19 g monomer M6 and 1.44 g Wako V-601 initiator in a container, and agitating the mixture to dissolve the components. 20 g PGME was introduced into a reaction vessel and the vessel was purged with nitrogen for 30 minutes. The reaction vessel was next heated to 95° C. with agitation. The feed solution was then introduced into the reaction vessel and fed over a period of 1.5 hours. The reaction vessel was maintained at 95° C. for an additional three hours with agitation, and was then allowed to cool to room temperature. The polymer (CP1) was precipitated by dropwise addition of the reaction mixture into methanol/water 20/80 (wt %), collected by filtration, and dried in vacuo.

Example 17 (Polymer CP2)

A feed solution was prepared by combining 10 g propylene glycol monomethyl ether (PGME), 7.70 g monomer M6, 2.30 g monomer M3 and 0.50 g Wako V-601 initiator in a container, and agitating the mixture to dissolve the components. 8.6 g PGME was introduced into a reaction vessel and the vessel was purged with nitrogen for 30 minutes. The reaction vessel was next heated to 95° C. with agitation. The feed solution was then introduced into the reaction vessel and fed over a period of 1.5 hours. The reaction vessel was maintained at 95° C. for an additional three hours with agitation, and was then allowed to cool to room temperature. The polymer (CP2) was precipitated by dropwise addition of the reaction mixture into methanol/water 20/80 (wt %), collected by filtration, and dried in vacuo.

Example 18 (Polymer CP3)

A feed solution was prepared by combining 13.00 g propylene glycol monomethyl ether (PGME), 24.00 g monomer M6, 6.00 g monomer M3 and 1.80 g Wako V-601 initiator in a container, and agitating the mixture to dissolve the components. 15.00 g PGME was introduced into a reaction vessel and the vessel was purged with nitrogen for 30 minutes. The reaction vessel was next heated to 95° C. with agitation. The feed solution was then introduced into the reaction vessel and fed over a period of 1.5 hours. The reaction vessel was maintained at 95° C. for an additional three hours with agitation, and was then allowed to cool to room temperature. The polymer (CP3) was precipitated by dropwise addition of the reaction mixture into methanol/water 20/80 (wt %), collected by filtration, and dried in vacuo.

TABLE 1

| Example | Polymer | Monomer A (mol %) | Monomer B (mol %) | Monomer C (mol %) | Mw | Mn | PDI |
| --- | --- | --- | --- | --- | --- | --- | --- |
| Ex. 1 | P1 | M1 (60) | M3 (40) | — | 6844 | 2622 | 2.61 |
| Ex. 2 | P2 | M1 (50) | M3 (50) | — | 3857 | 1973 | 1.96 |
| Ex. 3 | P3 | M1 (50) | M3 (40) | M4 (10) | 6034 | 2591 | 2.33 |
| Ex. 4 | P4 | M1 (45) | M3 (45) | M4 (10) | 4303 | 1957 | 2.19 |
| Ex. 5 | P5 | M1 (40) | M3 (50) | M4 (10) | 7875 | 3249 | 2.42 |
| Ex. 6 | P6 | M2 (60) | M3 (40) | — | 5744 | 2518 | 2.28 |
| Ex. 7 | P7 | M2 (55) | M3 (45) | — | 3574 | 1853 | 1.93 |
| Ex. 8 | P8 | M2 (50) | M3 (40) | M4 (10) | 7336 | 3318 | 2.21 |
| Ex. 9 | P9 | M2 (50) | M3 (40) | M4 (10) | 5337 | 2356 | 2.27 |
| Ex. 10 | P10 | M2 (45) | M3 (45) | M4 (10) | 5273 | 2339 | 2.25 |
| Ex. 11 | P11 | M2 (40) | M3 (50) | M4 (10) | 5520 | 2500 | 2.21 |
| Ex. 12 | P12 | M7 (60) | M3 (40) | — | 3812 | 1881 | 2.02 |
| Ex. 13 | P13 | M8 (60) | M3 (40) | — | 3460 | 1816 | 1.90 |
| Ex. 14 | P14 | M1 (40) | M3 (50) | M9 (10) | 4268 | 1936 | 2.20 |
| Ex. 15 | P15 | M1 (45) | M3 (45) | M10 (10) | 3606 | 1715 | 2.10 |
| Ex. 16 (Comp) | CP1 | M5 (50) | M6 (50) | — | 12750 | 5744 | 2.22 |
| Ex. 17 (Comp) | CP2 | M6 (77) | M3 (23) | — | 14130 | 5705 | 2.47 |
| Ex. 18 (Comp) | CP3 | M6 (80) | M3 (20) | — | 7540 | 4530 | 1.66 | vessel and the vessel was purged with nitrogen for 30 minutes. The reaction vessel was next heated to 95° C. with agitation. The feed solution was then introduced into the reaction vessel and fed over a period of 1.5 hours. The reaction vessel was maintained at 95° C. for an additional three hours with agitation, and was then allowed to cool to Dissolution Rate (DR) Evaluation The polymers identified in Table 2 were dissolved in 4-methyl-2-pentanol to make 14 wt % polymer solutions. 200 mm silicon wafers were primed with HMDS at 120° C. for 30 seconds, coated with a respective polymer solution, and softbaked at 80° C. for 60 seconds on a TEL Clean Track ACT-8 coating tool. Thickness of the resulting polymer films was measured on a Thermawave Optiprobe measurement tool. The polymer films were developed with MF CD-26 (0.26 N TMAH) (DuPont) developer for 60 seconds, and polymer film thickness was remeasured. Dissolution rate (DR) of the polymer films was calculated as:

(Pre-develop Thickness−Post-develop Thickness)/ development time.

If a polymer film was completely removed from the wafer after development, dissolution rate of a duplicate wafer was measured with the TMAH developer on a LithoTech Japan ARM 800 dissolution rate monitor at 470 nm interrogation wavelength.

TABLE 2

| Example | Polymer | DR (Å/s) |
|---|---|---|
| Ex. 19 | P2 | 588 |
| Ex. 20 | P3 | 912 |
| Ex. 21 | P7 | 4860 |
| Ex. 22 | P9 | 2832 |
| Ex. 23 | P10 | 4798 |
| Ex. 24 | P14 | 1194 |
| Ex. 25 (Comp) | CP1 | 0 |

Coating Defect Evaluation

Polymer solutions were made by dissolving polymers in solvents in the amounts described in Table 3. The polymer solutions were spin-coated at 1500 rpm on respective 200 mm Si wafers. The coated wafers were baked at 80° C. for 60 seconds. The wafers were then inspected on a KLA-Tencor 2800/Surfscan SP2 wafer surface inspection system. The system measured defects having a size greater than 45 nm. Two wafers were run consecutively for each pattern trimming composition tested, with the lower of the two measured defect values for each composition tested being provided in Table 3.

TABLE 3

| Example | Polymer (wt %) | Solvent 1 (wt %) | Solvent 2 (wt %) | Total Defects |
|---|---|---|---|---|
| Ex. 26 | P1 (3.00) | B1 (92.15) | B2 (4.85) | 89 |
| Ex. 27 | P3 (3.00) | B1 (92.15) | B2 (4.85) | 160 |
| Ex. 28 | P6 (3.00) | B1 (87.30) | B2 (9.70) | 224 |
| Ex. 29 | P14 (3.00) | B1 (87.30) | B2 (9.70) | 34 |
| Ex. 30 (Comp) | CP3 (4.00) | B1 (81.60) | B2 (14.40) | >50,000* |

B1 = Isoamyl ether; B2 = 4-methyl-2-pentanol; *>50K total defects is the upper limit detected.

Acid Synthesis

The following acids were used in making pattern trimming compositions as described below. Acids A1 and A3 were commercially obtained and Acid A2 was synthesized according to the following procedure.

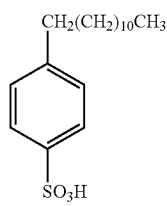

A1

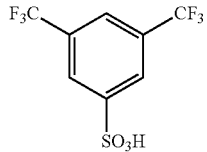

A2

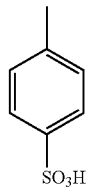

A3

Example 31 (Acid A2)

23.6 g 3,5-bis(trifluoromethyl)benzenesulfonyl chloride was dissolved in 12.5 g water and refluxed for 24 hours. Upon cooling, the reaction mixture was evaporated and dried under vacuum to yield white solids of acid A2 resulted (19 g, 85.5% yield). [$^1$H NMR ((CD$_3$)$_2$CO, 600 MHz): δ 8.15 (s, 1H), 8.34 (s, 2H), 10.81 (bs, 1H). $^{13}$C NMR ((CD$_3$)$_2$CO, 600 MHz): δ 123.94, 124.22, 126.56, 131.51, 146.79. $^{19}$F NMR ((CD$_3$)$_2$CO, 600 MHz): δ−63.51].

Preparation of Pattern Trimming Compositions

Photoresist pattern trimming compositions (PTCs) were prepared by dissolving solid components in solvents using the materials and amounts set forth in Table 4. The resulting mixtures, made on a 14-30 g scale, were shaken on a mechanical shaker for from 3 to 24 hours and then filtered through a PTFE disk-shaped filter having a 0.2 micron pore size.

TABLE 4

| Example | Pattern Trimming Composition | Polymer (wt %) | Acid (wt %) | Solvent B1 (wt %) | Solvent B2 (wt %) |
|---|---|---|---|---|---|
| Ex. 31 | PTC-1 | P3 (2.00) | A2 (0.06) | 97.94 | — |
| Ex. 32 | PTC-2 | P7 (2.29) | A1 (0.07) | 87.88 | 9.76 |
| Ex. 33 | PTC-3 | P10 (2.29) | A1 (0.07) | 87.88 | 9.76 |
| Ex. 34 | PTC-4 | P12 (2.94) | A1 (0.06) | 87.30 | 9.70 |
| Ex. 35 | PTC-5 | P13 (2.94) | A1 (0.06) | 87.30 | 9.70 |
| Ex. 36 | PTC-6 | P14 (2.91) | A2 (0.09) | 87.30 | 9.70 |
| Ex. 37 | PTC-7 | P15 (2.91) | A2 (0.09) | 87.30 | 9.70 |
| Ex. 38 (Comp) | PTC-8 | CP1 (2.92) | A3 (0.09) | 87.29 | 9.70 |
| Ex. 39 (Comp) | PTC-9 | CP2 (2.92) | A3 (0.09) | 19.40 | 77.59 |
| Ex. 40 (Comp) | PTC-10 | CP3 (6.00) | A2 (0.12) | 79.80 | 14.08 |

B1 = Isoamyl ether; B2 = 4-methyl-2-pentanol; All amounts provided as weight percent (wt %) based on total pattern trimming composition.

Photoresist Pattern Trimming Composition Evaluation

Pattern Trim Evaluation 200 mm silicon wafers were coated with AR™3-600 organic bottom anti-reflective coating (BARC) material (DuPont) and baked at 205° C. for 60 seconds to a thickness of 600 Å on a TEL Clean Track Act 8 coating tool. UV™217G-0.25 polyhydroxystyrene-based positive-tone photoresist (DuPont) was coated over the BARC layer and the wafers were softbaked at 130° C. for 60 seconds to a target thickness of 3550 Å on the coating tool. The coated wafers were exposed to KrF (248 nm) radiation on a Canon FPA-5000 ES4 DUV scanner with NA=0.68, conventional illumination (Sigma, 0.75) using a binary reticle with a 140 nm dense (1:1 line-space) trench patterns. The wafers were post-exposure baked at 125° C. for 60 seconds, developed with 0.26 N aqueous TMAH solution for 45 seconds, rinsed with distilled water and spun dry on a TEL Clean Track Act 8 coating tool. Resist pattern CD measurements were made using a Hitachi High Technologies Co. CG4000 CD-SEM to obtain initial CD values. The wafers were next coated with 400 Å of a respective pattern trimming composition, baked for 60 seconds at a temperature described in Table 4, rinsed with 0.26 N aqueous TMAH solution for 30 seconds, rinsed with distilled water and spun dry on a TEL Clean Track Act 8 coating tool. CD measurements of the resist patterns for the treated wafers were then made to obtain final CD values. The change in CD (ΔCD) for the treated patterns was calculated according to the following equation:

$$\Delta CD = CD_f - CD_i$$

wherein $CD_f$ is the average CD measurement after pattern trimming treatment, and $CD_i$ is the average CD measurement prior to pattern trimming treatment. The results are shown in Table 4.

TABLE 4

| Example | Pattern Trimming Composition | Bake Temp. (° C.) | ΔCD (nm) |
| --- | --- | --- | --- |
| Ex. 41 | PTC-1 | 80 | 29.2 |
| Ex. 42 | PTC-2 | 80 | 24.1 |
| Ex. 43 | PTC-3 | 80 | 19.4 |
| Ex. 44 | PTC-4 | 80 | 38.2 |
| Ex. 45 | PTC-5 | 80 | 47.4 |
| Ex. 46 | PTC-6 | 90 | 34.3 |
| Ex. 47 | PTC-7 | 90 | 34.4 |
| Ex. 48 (Comp) | PTC-8 | 80 | NM* |
| Ex. 49 (Comp) | PTC-9 | 80 | NM** |

NM* = $CD_f$ not measured/residue observed in pattern; NM** = $CD_f$ not measured/pattern damage observed.

Pattern Collapse Margin (PCM) Evaluation 200 mm silicon wafers were coated with AR™3 organic bottom antireflective coating (BARC) material (DuPont) and cured at 205° C. for 60 seconds to a thickness of 600 Å on a TEL Clean Track Act 8 coating tool. UV™217G-0.25 polyhydroxystyrene-based positive-tone photoresist (DuPont) was coated over the BARC layer and the wafers were softbaked at 130° C. for 60 seconds to a target thickness of 3550 Å on a TEL Clean Track Act 8 coating tool. The coated wafers were exposed to KrF (248 nm) radiation at various doses from 466 to 626 J/m² on a Canon FPA-5000 ES4 DUV scanner with NA=0.68, conventional illumination (Sigma, 0.75) using a binary reticle with 140 nm dense trench (1:1 line-space) patterns. The wafers were post-exposure baked at 125° C. for 60 seconds, developed with 0.26 N aqueous TMAH solution for 45 seconds, rinsed with distilled water and spun dry on a TEL Clean Track Act 8 coating tool. The wafers were next coated with 400 Å of a respective pattern trimming composition, baked for 60 seconds at a temperature described in Table 5, and rinsed with 0.26 N aqueous TMAH solution for 30 seconds, rinsed with distilled water and spun dry on a TEL Clean Track Act 8 coater/developer. CDs of the resist patterns for the treated wafers were then measured as described above. The SEM images of the patterns were observed for the occurrence of pattern collapse. The CDs of the largest non-collapsed trenches (PCM) are reported in Table 5, with a larger PCM value indicating better pattern collapse margin performance.

TABLE 5

| Example | Pattern Trimming Composition | PEB Temp. (° C.) | PCM (nm) |
| --- | --- | --- | --- |
| Ex. 50 | PTC-1 | 80 | 189 |
| Ex. 51 | PTC-3 | 80 | 189 |
| Ex. 52 (Comp) | None | — | 180 |
| Ex. 53 (Comp) | PTC-10 | 90 | 128 |

What is claimed is:

1. A photoresist pattern trimming composition, comprising a polymer, an aromatic sulfonic acid, and an organic-based solvent system, wherein the polymer comprises polymerized units of general formulas (I) and (II):

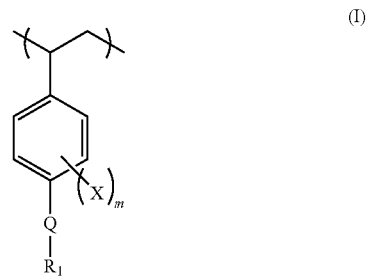

wherein: X independently represents a halogen atom; Q represents a single bond, —O—, or —C(O)O—; $R_1$ independently represents hydrogen, a halogen atom, C1-C12 alkyl or C1-C12 fluoroalkyl, wherein the alkyl or fluoroalkyl is unsubstituted or substituted with a hydroxy group; $R_2$ represents hydrogen, C1-C3 alkyl or C1-C3 fluoroalkyl; and m is an integer from 0 to 4; and wherein the polymerized units of general formula (I) are present in the polymer in an amount of from 10 to 90 mol % and the polymerized units of general formula (II) are present in the polymer in an amount from 10 to 60 mol %, based on total polymerized units of the polymer, wherein a weight average molecular weight of the polymer is from 3,000 to 50,000.

2. The photoresist pattern trimming composition of claim 1, wherein the polymer further comprises polymerized units of general formula (III):

(III)

wherein: $R_3$ represents hydrogen, a halogen atom, C1-C3 alkyl or C1-C3 fluoroalkyl; W represents O or NR, wherein R represents hydrogen or C1-C6 alkyl; and $R_4$ represents substituted or unsubstituted C1-C20 alkyl or C1-C20 heteroalkyl.

3. The photoresist pattern trimming composition of claim 2, wherein the polymerized units of general formula (III) are present in the polymer in an amount from 1 to 50 mol %, based on total polymerized units of the polymer.

4. The photoresist pattern trimming composition of claim 1, wherein the aromatic sulfonic acid is of general formula V:

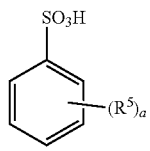

(V)

wherein: $R^5$ independently represents a halogen atom, hydroxy, substituted or unsubstituted alkyl, substituted or unsubstituted heteroalkyl, substituted or unsubstituted carbocyclic aryl, substituted or unsubstituted heterocyclic aryl, substituted or unsubstituted alkoxy, or a combination thereof, wherein adjacent $R^5$ groups together optionally form a fused ring with the aromatic group; and a represents an integer of from 0 to 5.

5. The photoresist pattern trimming composition of claim 1, wherein the organic-based solvent system comprises a monoether.

6. The photoresist pattern trimming composition of claim 5, wherein the organic-based solvent system further comprises an alcohol or an ester.

7. The photoresist pattern trimming composition of claim 1, wherein Q is a single bond or —O— and $R_1$ is C1-C12 alkyl.

8. A pattern formation method, comprising:
(a) providing a semiconductor substrate;
(b) forming a photoresist pattern over the semiconductor substrate, wherein the photoresist pattern is formed from a photoresist composition comprising a polymer comprising an acid labile groups and a photoacid generator;
(c) coating a pattern trimming composition of claim 1 over the photoresist pattern;
(d) heating the coated photoresist pattern; and
(e) rinsing the heated photoresist pattern with a rinsing agent to remove residual pattern treatment composition.

9. The pattern formation method of claim 8, wherein the rinsing agent is an aqueous tetramethylammonium hydroxide solution.

10. The pattern formation method of claim 8, wherein the photoresist pattern is formed by deep-UV or EUV lithography.

11. The pattern formation method of claim 8, wherein the polymer further comprises polymerized units of general formula (III):

(III)

wherein: $R_3$ represents hydrogen, a halogen atom, C1-C3 alkyl or C1-C3 fluoroalkyl; W represents O or NR, wherein R represents hydrogen or C1-C6 alkyl; and $R_4$ represents substituted or unsubstituted C1-C20 alkyl or C1-C20 hetero alkyl.

12. The pattern formation method of claim 11, wherein the polymerized units of general formula (III) are present in the polymer in an amount from 1 to 50 mol %, based on total polymerized units of the polymer.

13. The pattern formation method of claim 8, wherein the aromatic sulfonic acid is of general formula V:

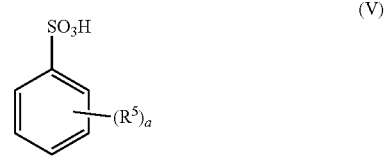

(V)

wherein: $R^5$ independently represents a halogen atom, hydroxy, substituted or unsubstituted alkyl, substituted or unsubstituted heteroalkyl, substituted or unsubstituted carbocyclic aryl, substituted or unsubstituted heterocyclic aryl, substituted or unsubstituted alkoxy, or a combination thereof, wherein adjacent $R^5$ groups together optionally form a fused ring with the aromatic group; and a represents an integer of from 0 to 5.

14. The pattern formation method of claim 8, wherein the organic-based solvent system comprises a monoether.

15. The pattern formation method of claim 14, wherein the organic-based solvent system further comprises an alcohol or an ester.

16. The pattern formation method of claim 8, wherein Q is a single bond or —O— and $R_1$ is C1-C12 alkyl.

* * * * *